(12) United States Patent
Cheng et al.

(10) Patent No.: US 11,925,058 B2
(45) Date of Patent: Mar. 5, 2024

(54) MICROCAVITY PIXEL ARRAY FABRICATION METHOD

(71) Applicant: Avalon Holographics Inc., St. John's (CA)

(72) Inventors: Jiaqi Cheng, St. John's (CA); Jordan Peckham, Portugal Cove—St. Philips (CA)

(73) Assignee: Avalon Holographics Inc., St. John's (CA)

( * ) Notice: Subject to any disclaimer, the term of this patent is extended or adjusted under 35 U.S.C. 154(b) by 0 days.

(21) Appl. No.: 18/154,977

(22) Filed: Jan. 16, 2023

(65) Prior Publication Data

US 2023/0157059 A1 May 18, 2023

Related U.S. Application Data

(62) Division of application No. 16/922,897, filed on Jul. 7, 2020, now Pat. No. 11,588,135.

(51) Int. Cl.
| | |
|---|---|
| *H10K 50/852* | (2023.01) |
| *H01S 5/042* | (2006.01) |
| *H01S 5/183* | (2006.01) |
| *H10K 71/00* | (2023.01) |

(52) U.S. Cl.
CPC ....... *H10K 50/852* (2023.02); *H01S 5/04256* (2019.08); *H01S 5/18361* (2013.01); *H10K 71/00* (2023.02)

(58) Field of Classification Search
CPC .. H10K 50/852; H10K 71/00; H01S 5/04256; H01S 5/18361
See application file for complete search history.

(56) References Cited

U.S. PATENT DOCUMENTS

| | | | |
|---|---|---|---|
| 6,366,017 B1 * | 4/2002 | Antoniadis | H10K 50/852 |
| | | | 313/506 |
| 7,510,455 B2 * | 3/2009 | Suzuki | H10K 50/852 |
| | | | 445/24 |
| 2005/0161665 A1 * | 7/2005 | Winters | H10K 50/852 |
| | | | 257/40 |
| 2015/0214508 A1 * | 7/2015 | Sakairi | H10K 59/12 |
| | | | 438/34 |
| 2017/0243928 A1 * | 8/2017 | Yang | H10K 50/818 |
| 2019/0013646 A1 * | 1/2019 | Tan | H01S 5/18311 |

* cited by examiner

*Primary Examiner* — Nduka E Ojeh

(57) ABSTRACT

A microcavity pixel design and structure allowing for tuning the optical cavity length of the microcavity of a microcavity pixel structure. This is achieved by including an intermediate electrode in the device which has an overhang region to form a connecting area to a bottom electrode, alleviating design restrictions in material type and dimensions throughout the optical microcavity tuning process. A method for the fabrication of a multi-colored microcavity pixel array facilitating the use of blanket deposition methods for select layers within a microcavity pixel structure.

20 Claims, 21 Drawing Sheets

MICROCAVITY PIXEL ARRAY FABRICATION METHOD

CROSS REFERENCE TO RELATED APPLICATIONS

This application is a divisional of U.S. patent application Ser. No. 16/922,897 filed on 7 Jul. 2020, now allowed, the contents of which are incorporated herein by reference in their entirety.

FIELD OF THE INVENTION

The present disclosure relates to microcavity pixel devices, and more particularly, organic light emitting diode (OLED) and vertical-cavity surface-emitting laser (VCSEL) microcavity design and fabrication processes for a high angular resolution, wide field of view, multiple view display.

BACKGROUND OF THE INVENTION

Light field displays provide multiple views, allowing a user to receive a separate view in each eye. While current displays in this category provide an interesting viewing experience, a captivating light field display requires a very high pixel density, very low angular separation between views, and a large viewing angle. It is desired that a user experiences smooth transitions between viewing zones, while maintaining an independent and perceivable view from the adjacent views. A fundamental requirement in achieving these viewing parameters is controlling the output characteristics of the emission source. Organic light-emitting diodes (OLEDs) bound in a microcavity allow control of the spectral bandwidth and output angle of the resulting light.

Organic light-emitting diodes consist of thin-film layers of organic material coated upon a substrate, generally made of glass, between two electrodes. OLEDs have a characteristic broad spectral width and Lambertian intensity distribution profile. The thin-film layers disposed between the anode and cathode commonly include one or more of an Organic Hole-Injection Layer (HIL), an Organic Hole-Transporting Layer (HTL), an Emissive Layer (EML), an Organic Electron-Transporting Layer (ETL), and an Organic Electron-Injection Layer. Light is generated in an OLED device when electrons and holes that are injected from the cathode and the anode (electrodes), respectively, flow through the ETL and the HTL and recombine in the EML.

One method for controlling the output characteristics of light is through the use of a microcavity. The microcavity is formed between two mirrors. The first mirror can be a metal cathode and the second mirror may be a layered stack of non-absorbing materials. The layered stack of non-absorbing materials is referred to as a distributed Bragg reflector (DBR). A DBR is an optical mirror composed of multiple pairs of two different dielectric layers with different refractive indices in an alternating order. The highest reflectivity is attained when the layer thicknesses are chosen such that the optical path length of each layer is one quarter of the resonance wavelength, commonly referred to as the Bragg Wavelength, $\lambda_{Bragg}$. Two main design variables affecting the output characteristics of a microcavity are the reflectance of the top and bottom surfaces (i.e. opposing mirrors) and the optical path length. The optical path length between the mirrors is a multiple of the wavelength. The wavelength of the light output by such a resonant OLED structure is dependent, in part, upon this optical path length of the microcavity. The optical path length in the cavity can be manipulated in different ways, one of which is by changing the thickness of the layers that make up the microcavity. One challenge for the design of OLEDs which are suitable for light-field displays is how to determine the optimum optical path length of the microcavity to decrease the spectral bandwidth and output angle.

The traditional two electrode microcavity OLED design is such that the materials and thicknesses of all layers within the organic stack must be chosen based on electron-hole balancing requirements, leaving little room for color tuning of the microcavity. As a result, an additional filler layer is often added to adjust the microcavity and for a larger Q factor and a thicker filler layer is required.

U.S. Pat. No. 7,023,013 to Ricks et al. describes an array of light-emitting OLED microcavity pixels. The pixels disclosed use transparent conductive oxides (TCO) such as indium tin oxide (ITO) and indium-doped zinc oxide (IZO) as the filler layer. While the cavity adjustment is possible, the materials choice and thickness for the filler layer are the main constraints. In particular, the filler layer must be conductive because it is also in the pathway of the electrical current that drives the OLED. However, a thicker TCO layer is not preferable because of optical loss due to non-negligible light absorption with the TCO.

U.S. Pat. No. 10,340,480 to Peckham describes a microcavity OLED device that places the filler layer outside of the vertical path of electrical current driving the OLED light by utilizing transparent and/or semi-transparent electrodes adjacent to the filler layer. Compared to U.S. Pat. Nos. 7,023,013, 10,340,480 removes the filler material and thickness constraints as now insulating dielectric materials can be used. However in this design of the multi-color microcavity OLED pixel array different thicknesses are required for R, G, B color. With this design, an additional patterning step for the filler layer after OLED patterning is required onto the sensitive OLED materials.

This background information is provided for the purpose of making known information believed by the applicant to be of possible relevance to the present invention. No admission is necessarily intended, nor should be construed, that any of the preceding information constitutes prior art against the present invention.

SUMMARY OF THE INVENTION

It is an object of the present invention to provide a microcavity pixel device comprising an organic light emitting diode (OLED) for vertical-cavity surface-emitting laser (VCSEL) microcavity design and fabrication processes for a high angular resolution, wide field of view, multiple view display. It is another object of the present invention to provide a microcavity pixel design and structure allowing for tuning the optical cavity length of the microcavity of a microcavity pixel structure. This is achieved by including an intermediate electrode in the device which has an overhang region to form a connecting area to a bottom electrode, alleviating design restrictions in material type and dimensions throughout the optical microcavity tuning process. It is another object of the present invention to provide a method for the fabrication of a multi-colored microcavity pixel array facilitating the use of blanket deposition methods for select layers within a microcavity pixel structure.

In an aspect there is provided a microcavity OLED comprising: a bottom first electrode on a substrate; a filler layer on top of the first electrode; an intermediate electrode on top of the filler layer comprising an overhang region and a connecting area, the connecting area electrically connecting the intermediate electrode to the bottom first electrode; an organic light emitting diode stack on top of the intermediate electrode; and a top electrode on top of the organic light emitting diode stack.

In an embodiment, the filler layer is selected from an inorganic material and an organic material.

In another embodiment, the filler layer thickness is selected to emit a desired wavelength range of light from the MCOLED.

In another embodiment, the intermediate electrode consists of a semi-transparent thin film metal.

In another embodiment, the intermediate electrode consists of a transparent conductive oxide material.

In another embodiment, the top electrode consists of a metal reflective surface.

In another embodiment, the top electrode consists of a semi-transparent conductive material.

In another embodiment, the top electrode is transparent.

In another embodiment, the microcavity organic light emitting diode further comprises a reflective surface on the top electrode.

In another embodiment, the reflective surface is a distributed Bragg reflector (DBR).

In another aspect there is provided a method for fabrication of a multi-colored microcavity organic light emitting diode (MCOLED) array, the method comprising: patterning a bottom first series of electrodes on a substrate; depositing a first filler layer selected for a first color on top of a first group of electrodes in the series of electrodes; depositing a second filler layer selected for a second color on top of a second group of electrodes in the bottom first series of electrodes; depositing an intermediate series of electrodes on the first filler layer and the second filler layer, each electrode in the intermediate series of electrodes comprising an overhang region and a connecting area, the connecting area electrically connecting each electrode in the intermediate series of electrodes to an electrode in the bottom first series of electrodes; depositing an organic light emitting diode stack on the intermediate series of electrodes; and depositing a top series of electrodes on the organic light emitting diode stack.

In an embodiment, the first filler layer has a first thickness different than a thickness of the second filler layer.

In another embodiment, the first filler layer is comprised of a first material and the second filler layer is comprised of a second material different than the first material.

In another embodiment, the top series of electrodes comprises a reflective surface.

In another embodiment, the method further comprises depositing a reflective surface on the top series of electrodes.

In another embodiment, depositing the organic light emitting diode stack comprises depositing a first monochromatic OLED stack for the first color on the intermediate series of electrodes on top of the first filler layer and depositing a second monochromatic OLED stack for the second color on the intermediate series of electrodes on top of the second filler layer.

In another embodiment, depositing the organic light emitting diode stack comprises depositing a white OLED stack on the series of intermediate electrodes.

In another embodiment, the method further comprises depositing a third filler layer selected for a third color on top of a third group of electrodes in the bottom first series of electrodes.

In another embodiment, the method further comprises depositing a pixel definition layer to cover the overhang region and leaving a portion of each intermediate electrode uncovered by the pixel definition layer forming an active area of the intermediate electrode.

In another embodiment, the first filler layer and the second filler layer are comprised of an inorganic material or an organic material.

In another embodiment, the first filler layer and the second filler layer are comprised of one or more layers of different materials.

In another embodiment, the intermediate series of electrodes comprise a semi-transparent conductive material.

In another embodiment, the intermediate series of electrodes comprise a transparent conductive oxide material.

In another embodiment, the top series of electrodes comprise semi-transparent metal.

In another embodiment, the top series of electrodes consist of a transparent surface.

In another embodiment, the method further comprises depositing a reflective surface on the top series of electrodes.

In another embodiment, the reflective surface is a distributed Bragg reflector (DBR).

In another embodiment, the reflective surface is a shared distributed Bragg reflector covering the top series of electrodes comprising sublayers of alternating dielectric material.

In another embodiment, the first group of electrodes in the series of electrodes has a first distributed Bragg reflector and the second group of electrodes in the series of electrodes has a second distributed Bragg reflector, each distributed Bragg reflector comprising sublayers of alternating dielectric material deposited thereon.

In another aspect there is provided a multi-colored microcavity organic light emitting diode (MCOLED) array comprising: a bottom first series of electrodes on a substrate; a first filler layer selected for a first color on top of a first group of electrodes in the bottom first series of electrodes; a second filler layer selected for a second color on top of a second group of electrodes in the bottom first series of electrodes; an intermediate series of electrodes on the first filler layer and the second filler layer, each electrode in the intermediate series of electrodes comprising an overhang region and a connecting area, the connecting area electrically connecting each electrode in the intermediate series of electrodes to an electrode in the bottom first series of electrodes; an organic light emitting diode stack on the intermediate series of electrodes; and a top series of electrodes on the organic light emitting diode stack.

In an embodiment, the first filler layer and the second filter later are selected from an inorganic material and an organic material.

In another embodiment, the first filler layer has a first thickness different than a thickness of the second filler layer.

In another embodiment, the intermediate series of electrodes consist of a semi-transparent thin film metal.

In another embodiment, the intermediate series of electrodes consist of a transparent conductive oxide material.

In another embodiment, the top series of electrodes consist of a metal reflective surface.

In another embodiment, the top series of electrodes consist of a semi-transparent conductive material.

In another embodiment, the top series of electrodes are transparent.

In another embodiment, the MCOLED array further comprises a reflective surface on the top series of electrodes.

In another embodiment, the reflective surface is a distributed Bragg reflector (DBR).

In another aspect there is provided a method for fabrication of a multi-colored microcavity organic light emitting diode array, the method comprising: patterning a bottom first series of electrodes on a substrate; depositing a first filler layer selected for a first color on top of a first group of electrodes in the bottom first series of electrodes; depositing a second filler layer selected for a second color on top of a second group of electrodes in the bottom first series of electrodes; depositing an intermediate series of electrodes on the first filler layer and the second filler layers each electrode in the intermediate series of electrodes comprising an overhang region electrically connecting each intermediate electrode to a corresponding electrode in the bottom first series of electrodes; blanket depositing a white organic light emitting stack on the intermediate series of electrodes; and blanket depositing a top series of electrodes on the white organic light emitting stack.

In another embodiment, the top series of electrodes comprises a reflective surface.

In another embodiment, the method further comprises depositing a third filler layer selected for a third color on top of a third group of electrodes in the bottom first series of electrodes.

In another embodiment, the method further comprises depositing a pixel definition layer to cover the overhang region and the connecting area and leaving a portion of each intermediate electrode uncovered by the pixel definition layer forming an active area of the intermediate electrode.

In another embodiment, the first filler layer and the second filler layer are comprised of an inorganic material or an organic material.

In another embodiment, the first filler layer and the second filler layer are comprised of one or more layers of different materials.

In another embodiment, the intermediate series of electrodes comprise a semi-transparent thin film metal.

In another embodiment, the intermediate series of electrodes comprise a transparent conductive oxide material.

In another embodiment, the top series of electrodes comprise a semi-transparent metal.

In another embodiment, the top series of electrodes consist of a transparent surface.

In another embodiment, the method further comprises depositing a reflective surface on the top series of electrodes.

In another embodiment, the reflective surface is a distributed Bragg reflector (DBR).

In another embodiment, the reflective surface is a shared distributed Bragg reflector covering the top series of electrodes.

In another aspect there is provided a vertical surface emitting laser (VCSEL) comprising: a substrate; a bottom first electrode on the substrate; a Distributed Bragg Reflector (DBR) comprising multiple layers alternating between a high refractive index material and a low refractive index material; a filler layer on top of the DBR; an intermediate electrode on top of the filler layer comprising an overhang region and a connecting area, the connecting area electrically connecting the intermediate electrode to the bottom first electrode; a pixel definition layer on top of the intermediate electrode to cover the overhang region and leaving a portion of each intermediate electrode uncovered forming an active area of the intermediate electrode; a light emitting material stack on top of the active area of the second electrode; a third electrode on top of the light emitting material stack; and a distributed Bragg reflector deposited on top of the third electrode.

BRIEF DESCRIPTION OF THE DRAWINGS

These and other features of the invention will become more apparent in the following detailed description in which reference is made to the appended drawings.

DETAILED DESCRIPTION OF THE INVENTION

Figure 1A:
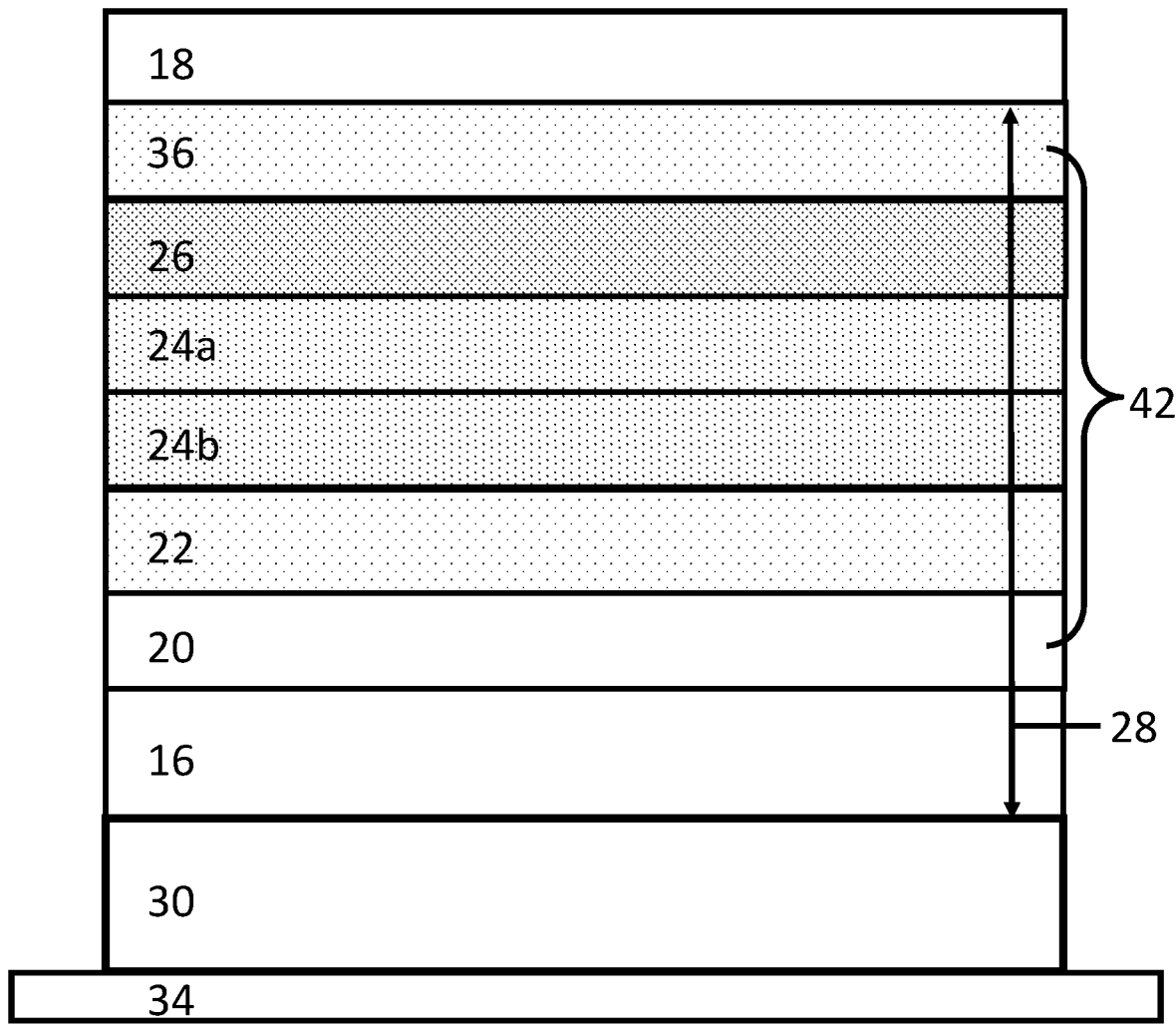
FIG. 1A: illustrates a microcavity organic light emitting diode (MCOLED) orientations as known in the art.

The present disclosure relates generally to a microcavity organic light-emitting diode (OLED) design and structure and a method of tuning a multi-color microcavity organic light emitting diode (MCOLED) achieved by including an intermediate electrode to connect with a first electrode of a MCOLED structure to alleviate the re-evaluation of electron-hole balancing considerations when tuning the optical microcavity of the device. The addition of the intermediate electrode enables the designer to separate the optimization of the electrical properties of the organic material stack and the optical properties of the MCOLED structure.

Disclosed are methods for designing and making an OLED device for a red, green, or blue light emission comprising an intermediate electrode deposited on top of a filler layer, the intermediate electrode configured to connect with the first electrode of the OLED device, therefore alleviating electron-hole charge balancing requirement reconsideration when tuning the optical cavity. In addition to greater flexibility in material selection and thickness, the intermediate cathode connection with the first electrode allows for an optimized process for MCOLED array fabrication as no additional patterning step is required after OLED stack is patterned.

In an embodiment of the method, the MCOLED structure as described by the present disclosure may include a metal reflective surface as the third electrode and an opposing reflective surface comprising a distributed Bragg reflector (DBR). DBR design is an alternating stack of dielectric materials of specific thicknesses ensuring the optical path length is a quarter of the designed wavelength and suitable for use with an OLED of any colour. The highest reflectivity of a DBR is attained when the layer thicknesses are chosen such that the optical path length of each layer is one quarter of the resonance wavelength. With each layer having an optical path length of $\lambda_{Bragg}/4$, all reflections will add in phase, and the transmissivity will decrease exponentially as a function of mirror thickness. At longer or shorter wavelengths than the stopband, the reflections begin to add out of phase, therefore the total reflections decreases [Ref. 01]. This gives a broad-band high-reflectivity region centered on the Bragg wavelength, called the stop band, with oscillating side-lobes on either side [Ref 04]. The DBR is generally composed of pairs of two different dielectric layer with different refractive indices, but may also be composed of multiple dielectric materials or other transparent materials with a contrast in n, as long as the optical path length of each layer is $\Delta_{Bragg}/4$. The multilayer mirror consists of alternating layers of substantially non-absorbing materials of appropriately chosen thickness. Typically, each layer is of thickness $$\frac{\lambda}{4n},$$

where $\lambda$ is advantageously chosen to correspond approximately to the center wavelength of the EML emission spectrum, e.g., 500-550 nm. Such mirrors are well known. The reflectivity of the mirror depends in a known way on the number of layer pairs, layer thickness and the refractive index of the materials used. Exemplary material pairs in the visible wavelength region are $Si_3N_4$, $SiO_2$, and $TiO_2$.

In addition to MCOLED structures, an intermediate electrode can be implemented in a vertical-cavity surface-emitting laser (VCSEL) structure. A vertical orientation is more advantageous than the Edge Emitting Lasers (EEL) that emits light from the side or from the Light Emitting Diodes (LED) that produce light from the sides and top, as VCSELs discharge light perpendicular to the surface of a laser, which allows thousands of VCSELs to be processed all at one time in a wafer. Incorporating the intermediate electrode to connect with the first electrode in the VCSEL structure allows for increased material and thickness options for the remaining layers above the intermediate electrode by removing the requirement to re-evaluate electron-hole balancing requirements in the cavity region when tuning the optical cavity of the device. The advantages for this VCSEL structure mirror those achieved by the MCOLED regarding material and thickness selection in layers above the intermediate electrode.

Various features of the invention will become apparent from the following detailed description taken together with the illustrations in the Figures. The design parameters, design method, construction, and use of the microcavity OLED design process and structures disclosed herein are described with reference to various examples representing embodiments which are not intended to limit the scope of the invention as described and claimed herein. The skilled technician in the field to which the invention pertains will appreciate that there may be other variations, examples and embodiments of the invention not disclosed herein that may be practiced according to the teachings of the present disclosure without departing from the scope of the invention.

Definitions

Unless defined otherwise, all technical and scientific terms used herein have the same meaning as commonly understood by one of ordinary skill in the art to which this invention pertains.

The use of the word "a" or "an" when used herein in conjunction with the term "comprising" may mean "one," but it is also consistent with the meaning of "one or more," "at least one" and "one or more than one."

As used herein, the terms "comprising," "having," "including" and "containing," and grammatical variations thereof, are inclusive or open-ended and do not exclude additional, unrecited elements and/or method steps. The term "consisting essentially of" when used herein in connection with a composition, device, article, system, use, or method, denotes that additional elements and/or method steps may be present, but that these additions do not materially affect the manner in which the recited composition, device, article, system, method, or use functions. The term "consisting of" when used herein in connection with a composition, device, article, system, use, or method, excludes the presence of additional elements and/or method steps. A composition, device, article, system, use, or method described herein as comprising certain elements and/or steps may also, in certain embodiments consist essentially of those elements and/or steps, and in other embodiments consist of those elements and/or steps, whether or not these embodiments are specifically referred to.

As used herein, the term "about" refers to an approximately +/−10% variation from a given value. It is to be understood that such a variation is always included in any given value provided herein, whether or not it is specifically referred to.

The recitation of ranges herein is intended to convey both the ranges and individual values falling within the ranges, to the same place value as the numerals used to denote the range, unless otherwise indicated herein.

The use of any examples or exemplary language, e.g. "such as", "exemplary embodiment", "illustrative embodiment" and "for example" is intended to illustrate or denote aspects, embodiments, variations, elements or features relating to the invention and not intended to limit the scope of the invention.

As used herein, the terms "connect" and "connected" refer to any direct or indirect physical association between elements or features of the present disclosure. Accordingly, these terms may be understood to denote elements or features that are partly or completely contained within one another, attached, coupled, disposed on, joined together, in communication with, operatively associated with, etc., even if there are other elements or features intervening between the elements or features described as being connected.

As used herein, the term "DBR" refers to a distributed Bragg reflector. A distributed Bragg reflector (DBR) is an optical mirror which is composed of multiple pairs of two different dielectric layers with different refractive indices in an alternative order [Ref. 06].

As used herein, the term "transparent" refers to a material which allows visible light to pass through it.

As used herein, the term "transparent conductive oxide" or TCO refers to a doped metal oxide commonly used in optoelectronic devices. TCO materials include but are not limited to Indium Tin Oxide (ITO), Fluorine-doped Tin Oxide (FTO), Aluminum-doped Zinc Oxide (AZO), Indium-doped Zinc Oxide (IZO), and Gallium-doped Zinc Oxide (ZnO).

As used herein, the term "pixel" refers to a light source and light emission mechanism used to create a display.

As used herein, the term "vertical-cavity surface-emitting laser (VCSEL)" refers to a semiconductor-based laser diode that emits light or optical beam vertically from its top surface.

As used herein, the term "Q factor" refers to a dimensionless parameter and is used to indicate performance of a VCSEL. In optics, the Q factor of a resonant cavity refers to:

$$Q = 2\pi f_o E/P$$

where $f_o$ is the resonant frequency, E is the energy stored in the cavity, P is the power dissipated.

As used herein, the term "electron-hole balancing" refers to the charge balance within an organic light emitting diode device. Electrons and holes injected from the respective contacts recombine in an emission zone to form excitons which undergo radiative emission to generate light. The external device efficiency is determined by the fraction of light, which is generated in the device stack and extracted to air. In an OLED device, the internal device efficiency is highly dependent on the charge balance of the device.

As used herein, the term "subpixel" refers to a structure comprised of a light emitting device housed within an optical microcavity. The optical microcavity is operatively associated with a plurality of reflective surfaces to substantially collimate, manipulate or tune the light. At least one of the reflective surfaces is a light propagating reflective surface connected to the optical microcavity to propagate the light out of the microcavity. The present disclosure provides individually addressable red, green, and blue (RGB) subpixels. The subpixel size as presently described is in a nanoscale to several microns range, which is significantly smaller than the pixel size previously known in the art.

As used herein, the acronym "FWHM" refers to 'full width half maximum', which is an expression of the extent of a function given by the difference between the two extreme values of the independent variable at which the dependent variable is equal to half of its maximum value.

As used herein, the term "OLED" refers to an Organic Light Emitting Diode, which is an opto-electronic device which emits light under the application of an external voltage. OLEDS can be divided into two main classes: those made with small organic molecules and those made with organic polymers. An OLED is a light-emitting diode in which the emissive electroluminescent layer comprises a film of organic compound that emits light in response to an electric current. Generally, an OLED is a solid-state semiconductor device [Ref 09] comprised at least one conducting organic layer disposed between and electrically connected to an anode and a cathode. When a current is applied, the anode injects holes and the cathode injects electrons into the organic layers. The injected holes and electrons each migrate toward the oppositely charged electrode. When an electron and hole localize on the same molecule, an exciton, which is a localized electron-hole pair having an excited energy state, is formed. Light is emitted when the exciton relaxes via a photoemissive mechanism. Types of OLEDs include, but are not limited to: [Ref. 09]

a. Active-Matrix OLEDs (AMOLED)

AMOLEDs have full layers of cathode, organic molecules and anode. The anode layers have a thin film transistor (TFT) plane in parallel to it so as to form a matrix. This helps in switching each pixel to its on or off state as desired, thus forming an image. Hence, the pixels switch off whenever they are not required or there is a black image on the display, increasing the battery life of the device. This is the least power consuming type of OLED and has quicker refresh rates which makes them suitable for video. The best uses for AMOLEDs are computer monitors, large-screen TVs and electronic signs or billboards.

b. Top-Emitting OLEDs

Top-emitting OLEDs have a substrate that is either opaque or reflective. Top-emitting OLEDs are better suited for active-matrix applications as they can be more easily integrated with a non-transparent transistor backplane. Manufacturers use top-emitting OLED displays in smart cards.

c. Bottom-Emitting OLEDs

An OLED is bottom emitting if the emitted light passes through the transparent or semi-transparent bottom electrode and substrate.

As used herein, the term "microcavity" refers to a structure formed by reflecting faces on the two sides of a spacer layer or optical medium, such as, for example, an OLED.

As used herein, the term "microcavity OLED" (MCOLED) refers to the materials of an OLED, as previously described, bound in a microcavity defined by two reflective surfaces, in which the reflective surfaces can be metallic materials, dielectric materials arranged in such a way to reflect light within a specific range, or a combination of dielectric and metallic materials.

As used herein, the term "monochromatic microcavity organic light emitting diode (MCOLED)" refers to a MCOLED tuned to emit a single color.

As used herein, the term "electrode" refers to a conductor through which electricity enters or leaves an object, substance, or region.

As used herein, the term "cathode" refers to the negatively charged electrode by which electrons enter an electrical device.

As used herein, the term "anode" refers to the positively charged electrode by which the electrons leave an electrical device.

As used herein, the term "patterning" refers to a technique using a series of post treatments to chemically engrave a transferred pattern into or allow the deposition of new material in the transferred pattern upon a target material.

As used herein, the term "blanket deposition" refers to depositing material without using a patterning technique.

As used herein, the term "mirror" refers to an object that reflects light in such a way that, for incident light in some range of wavelengths, the reflected light preserves many or most of the detailed physical characteristics of the original light, called specular reflection. Two or more mirrors aligned exactly parallel and facing each other can give an infinite regress of reflections, called an infinity mirror effect.

As used herein, the term "transmissivity" refers to the percentage of light transmitted per the incident light.

As used herein, the term "wavelength" is a measure of distance between two identical peaks (high points) or troughs (low points) in a wave, which is a repeating pattern of traveling energy such as light or sound.

As used herein, the term "simulation" refers to the production of a computer model of something, especially for the purpose of study or to develop and refine fabrication specifications. Various simulation methods can be used, including but not limited to the following. The finite-difference time-domain (FDTD) method is used to solve problems in electromagnetics and photonics, solving Maxwell's equations in complex geometries. FDTD is a versatile finite difference method in the time domain which treats nonlinear material properties in a natural way and allows a user to measure the system response over a wide range of frequencies. A comparable technique is Rigorous Coupled Wave Analysis (RCWA), which is a semi-analytical method, generally employed to solve field diffraction problems of a periodic structure. RCWA decomposes fields into a set of plane waves, representing the fields by a sum of spatial harmonics in Fourier-space. RCWA benefits from a decreased simulation complexity and time but suffers inaccuracy for more complex geometries.

It is contemplated that any embodiment of the compositions, devices, articles, methods and uses disclosed herein can be implemented by one skilled in the art, as is, or by making such variations or equivalents without departing from the scope and spirit of the invention.

Design Considerations for MCOLEDs

An organic light emitting diode (OLED) structure typically includes a substrate, a first electrode, an OLED stack of organic material layers, and a second electrode. The organic materials stack may include a hole injection layer (HIL), a hole transport layer (HTL), an electron injection layer (EIL), an electron transport layer (ETL) and an emissive layer (EML). Material and thickness design considerations for the layers of the OLED stack of a MCOLED are based upon the desired indices of refraction n and electron-hole balancing requirements. A balanced charge injection results from the equal flow rate of electrons/holes to the emissive layer (EML). If an OLED device is unbalanced, the electrons or holes will accumulate and charge the emission layer, thereby compromising device output.

A microcavity organic light emitting diode (MCOLED) is a device in which the materials of an OLED are bound in a microcavity defined by two reflective surfaces arranged in such a way to reflect light within a specific range, or some combination of dielectric and metallic materials. The organic materials which make up the OLED stack are arranged with material thicknesses $d_j$ which have an optical path length of $L_j$, where $L_j = n_j \times d_j$, and where $n_j$ is the refractive index of the OLED material. The sum of the optical path length of the materials between the reflective surfaces is designed to equal $$\frac{m\lambda_i}{2},$$

where $\lambda_i$ is the peak design wavelength of the MCOLED. The optical path length can therefore be changed by changing the thickness of one or more of the materials between the reflective surfaces, or by adding one or more additional filler material. The use of a microcavity in an OLED structure decreases the spectral width of the OLED, decreases the angular output, and increases the overall efficiency. Tuning of the optical microcavity for specific wavelengths of light, or color, is a challenging task as tuning a microcavity is achieved by creating a resonance at a specific wavelength between two reflective surfaces, completed by selecting and defining material thickness, refractive index, and phase change through careful analysis and simulations.

A MCOLED as described in U.S. Pat. No. 7,023,013 is shown in FIG. 1A. This structure has a semi-transparent material as a bottom first electrode 30 on a substrate 34. A filler layer 16 of transparent oxides such as indium tin oxide (ITO) and IZO are deposited on top of the bottom first electrode 30 as the filler layer. The OLED stack 42 is deposited on top of the filler layer 16 followed by the top electrode 18 which acts as a reflector to form an optical microcavity 28. The OLED stack 42 in this structure consists of a HIL 20, HTL 22, emissive layers (EMLs) 24a, 24b, ETL 26, and EIL 36. While adjustment of the optical microcavity 28 is possible, the materials choice and thickness for the filler layer 16 are the main constraints. In this art, the filler layer 16 must be conductive because it is in the pathway of the electrical current that drives the OLED. However, a thicker filler layer 16 layer is not preferable because of optical loss due to non-negligible light absorption with the filler layer 16 material.

Figure 1B:
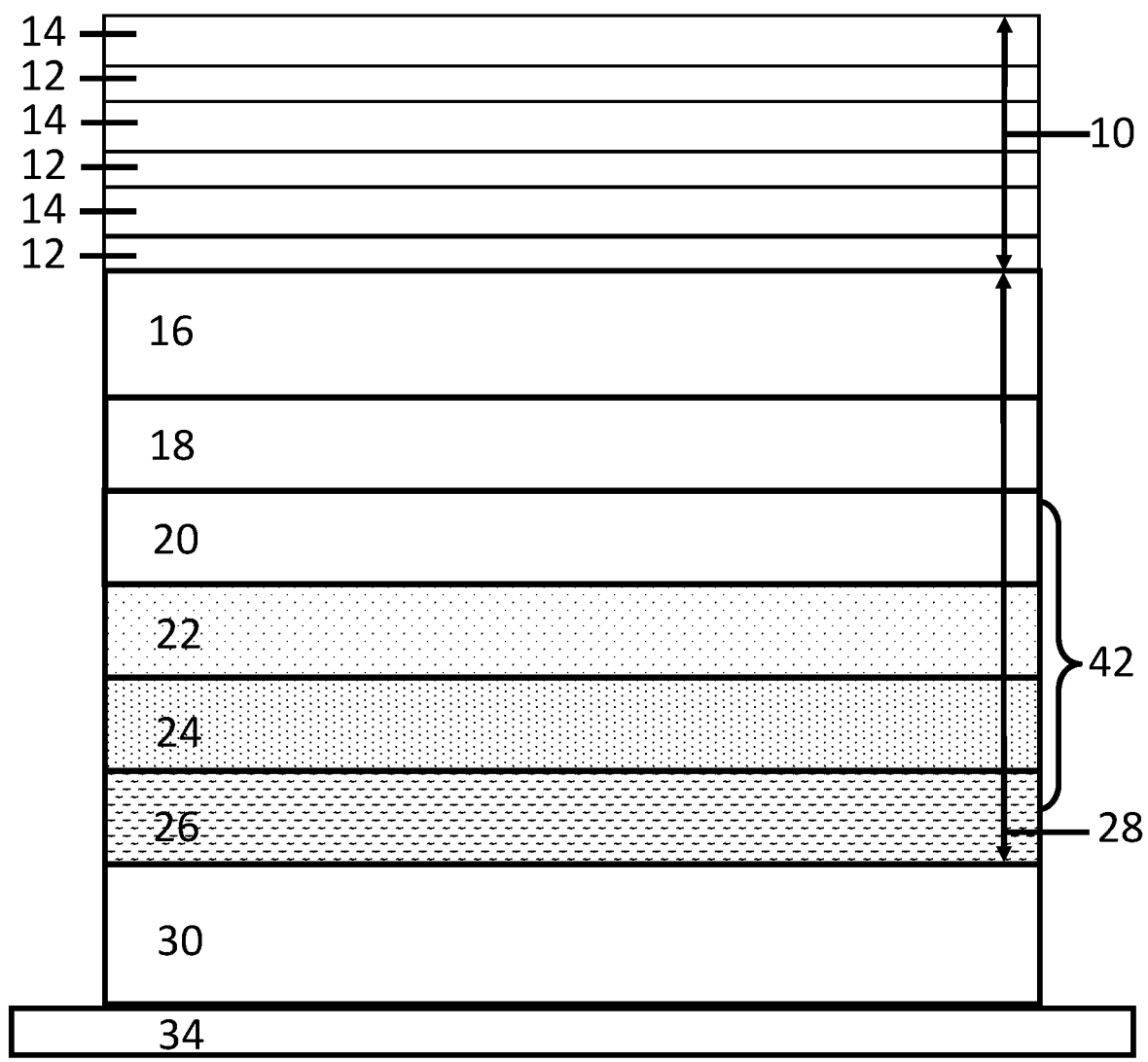
FIG. 1B: illustrates a microcavity organic light emitting diode (MCOLED) orientations as known in the art.

FIG. 1B illustrates a MCOLED device as described in U.S. Pat. No. 10,340,480. This configuration with bottom first electrode 30 on a substrate 34 places the filler layer 16 outside of the vertical path of electrical current driving the OLED light by utilizing a transparent and/or semi-transparent top electrode 18 adjacent to the filler layer 16. Compared to the device as described in U.S. Pat. No. 7,023,013, this configuration removes the filler layer 16 material and thickness constraints as now insulating dielectric materials can be used. With this design, an additional patterning step for the filler layer 16 after OLED patterning is then required to the fragile and sensitive materials of the OLED stack 42. The OLED stack 42 includes an ETL 26, EML 24, HTL 22 and a HIL 20. The transparent and/or semi-transparent top electrode 18 is deposited on top of the OLED stack 42 and a filler layer 16 is deposited on top of the top electrode 18 and a distributed Bragg reflector (DBR) 10 is positioned on top of the filler layer 16. The DBR 10 consists of a series of alternating layers of high refractive index dielectric material 14 and low refractive index dielectric material 12. The DBR 10 acts as the second reflective surface to form the optical microcavity 28.

Figure 2:
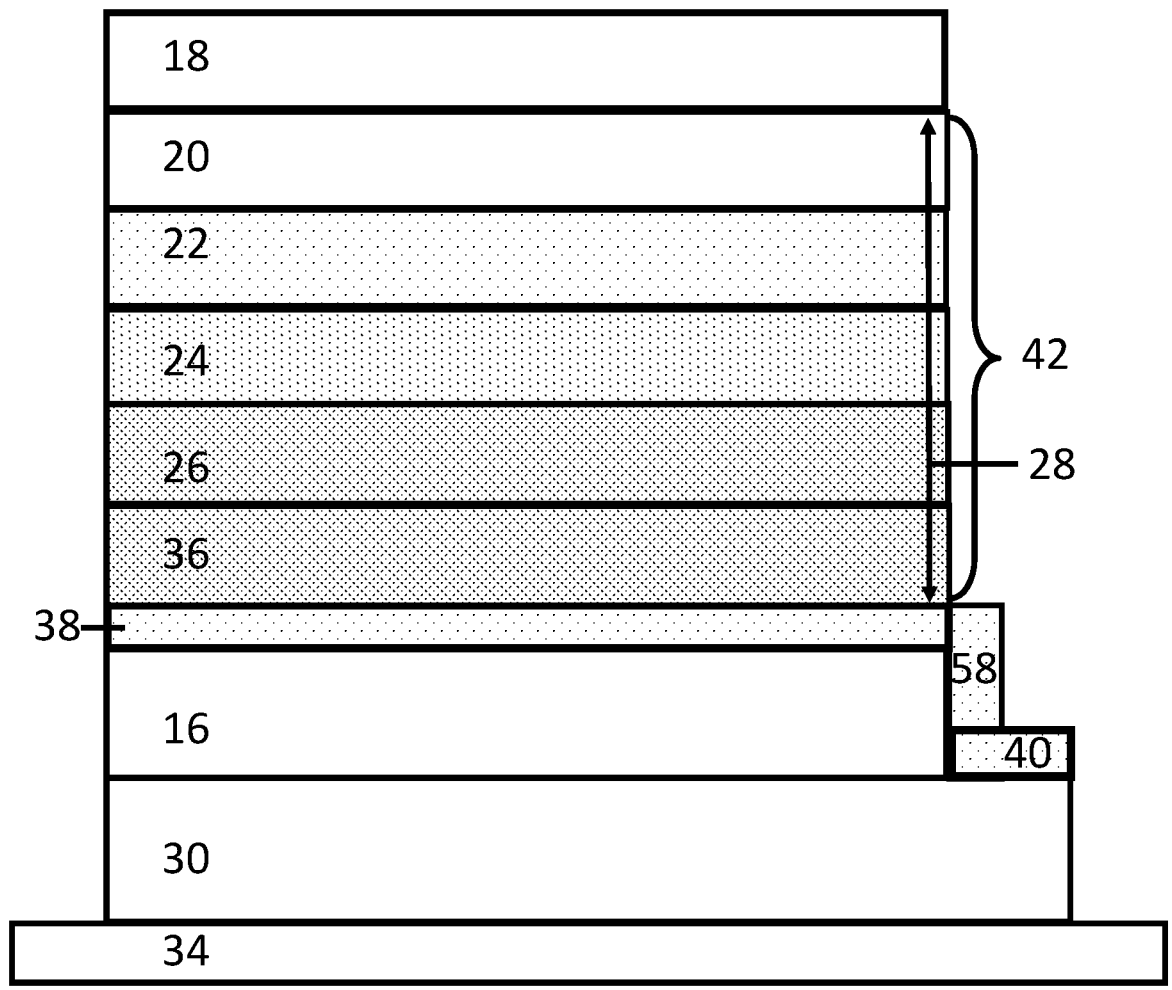
FIG. 2: illustrates an embodiment of a MCOLED as per the present disclosure including a top electrode which acts as a reflective surface to form the optical microcavity of the MCOLED.

FIG. 2 illustrates an embodiment of a microcavity OLED device as disclosed herein. The MCOLED device has a bottom first electrode 30 deposited on a substrate 34. A filler layer 16 is then deposited on the bottom first electrode 30. A semi-transparent/transparent intermediate electrode 38 is then deposited on top of the filler layer 16. The OLED stack 42 is then deposited on top of the intermediate electrode 38. In this embodiment, the OLED stack 42 includes an EIL 36, ETL 26, EML 24, HTL 22, and a HIL 20. A top electrode 18 is then deposited on the OLED stack 42 and the top electrode 18 is a reflective surface and therefore is used to form an optical microcavity 28. The intermediate electrode 38 is deposited such that it covers the overhang of the filler layer 16 to form an overhang region 58 and connects to the bottom first electrode 30 to form a connecting area 40 thereby forming an electrical contact between the bottom first electrode 30 and the intermediate electrode 38. The connection (the overhang region 58 and the connecting area 40) between the bottom first electrode 30 and the intermediate electrode 38 can be made with the same material, or any other conductive material, such as, for example, TCO. This connection formed by the connecting area 40 removes the requirement for reconsiderations of electron-hole charge balancing requirements for all material types and thicknesses of the layers of the OLED stack 42 when tuning the optical microcavity 28 by altering the optical path length of the microcavity. This is advantageous in that organic layer designs need not be altered to balance the charge of the OLED stack 42, and the filler layer 16 thickness alone may be adjusted to alter the optical path length of the optical microcavity 28. The bottom first electrode 30 may be an anode or a cathode, therefore the OLED device may be a conventional configuration or an inverted configuration. A conventional OLED configuration is one such that the bottom first electrode 30 before the OLED stack 42 is an anode and the top electrode 18 above the OLED stack 42 is a cathode. For inverted OLEDs, the bottom first electrode 30 before the OLED stack 42 is a cathode and the top electrode 18 above the OLED stack 42 is an anode.

The electron transport layer (ETL) 26 can be any substantially transparent material that can facilitate electron transport from the relevant electrode to the emissive layer 24. Examples of such materials can include but are not limited to 2-(4-biphenyl)-5-phenyl-1,3,4-oxadiazole (PBD), butyl PBD, or either of these previously mentioned materials doped in an inert polymer such as poly(methyl methacrylate) (PMMA) or a poly(carbonate). Emissive layer (EML) 24 materials can include but are not limited to Alq (Tris(8-hydroxyquinolinato)aluminum), aromatic hydrocarbons, poly(phenylene vinylenes), oxadiazole and stilbene derivatives. The EML 24 material optionally can be a stable non-emissive host material doped with an emissive material which has an energy gap that is less than that of the primary component of the EML 24 material. The hole transport layer (HTL) 22 can be any substantially transparent material that can facilitate the transport of holes to the EML 24 layer, where electron-hole recombination takes place. Examples of suitable materials include but are not limited to diamines (e.g., N,N'-diphenyl-N,N'-bis (3-methylphenyl)-1,1'-biphenyl-4,4'-diamine) and poly(phenylene vinylenes).

The bottom first electrode 30 may be a transparent material such as indium tin oxide (ITO) or a conducting polymer such as doped polyaniline, or a thin layer (e.g., about 10 nm) of metal (e.g., Ag, Au or Al), and may be unpatterned or patterned (e.g., into rows or columns). The top electrode 18 can be a reflective metal, a semi-transparent, thin-film metal or a transparent conductive oxide such as, for example, Indium Tin Oxide (ITO), Fluorine Doped Tin Oxide (FTO) or Aluminum-doped Zinc Oxide (AZO) and Indium-doped Zinc Oxide (IZO), or Ga-doped Zinc Oxide (ZnO). The bottom first electrode 30 can be deposited, for example, with sputtering, evaporation, or spin coating techniques. Preferably, the bottom first electrode 30 is deposited by evaporation and/or sputtering. The patterning can be done, for example, using lithography or shadow mask. The intermediate 38 electrode can be deposited with sputtering, thermal evaporation, atomic layer deposition, or spin casting techniques, and is preferably deposited by sputtering. The patterning can be done using lithography or shadow mask, preferably shadow mask. The top electrode 18 can be deposited by, for example, sputtering, thermal evaporation, atomic layer deposition, or spin casting. Preferably, thermal evaporation can be used to reduce potential damage to the underlying organic layers. No patterning is required for top electrode 18 layer.

The filler layer 16 can be any substantially transparent material that is chemically stable under the manufacturing and operating conditions and that can be patterned by an appropriate technique. Examples of filler materials include organic materials such as transparent polymers (e.g., a polyimide) or inorganic materials such as transparent inorganic dielectrics (e.g., $Si_3N_4$. or $SiO_2$). In a top-emitting configuration of the OLED, the substrate 34 need not be transparent. It can be metal or a semiconductor, e.g., Silicon, however, is generally glass, or polyimide. This design is also suitable for active matrix OLED (AMOLED) displays as the bottom first electrode 30 can be connected to a TFT (thin film transistor) pixel circuit underneath.

Figure 3:
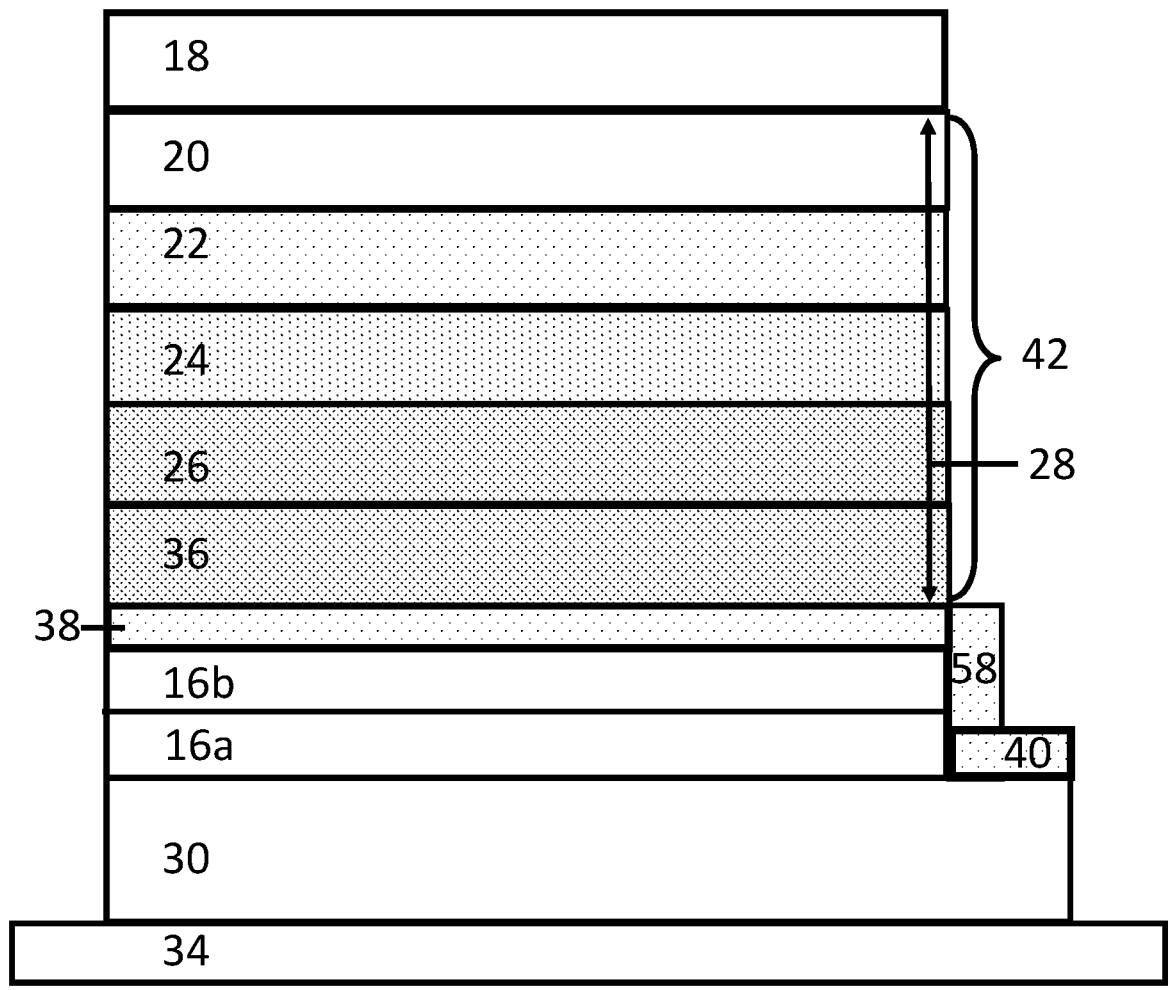
FIG. 3: illustrates an embodiment of a MCOLED as per the present disclosure including a multi layer filler layer.

FIG. 3 illustrates an embodiment of a microcavity OLED device as disclosed herein. The MCOLED device has a bottom first electrode 30 deposited on a substrate 34. A multi layer filler layer 16a, 16b is then deposited on the bottom first electrode 30. Each layer of the multi layer filler layer 16a, 16b may consist of the same material or of different materials. The filler layers 16a, 16b may be of the same or of different thicknesses. A semi-transparent/transparent intermediate electrode 38 is then deposited on top of the filler layer 16a, 16b. The OLED stack 42 is then deposited on top of the intermediate electrode 38. In this embodiment, the OLED stack 42 includes an EIL 36, ETL 26, EML 24, HTL 22, and a HIL 20. A top electrode 18 is then deposited on the OLED stack 42 and the top electrode 18 is a reflective surface and therefore is used to form an optical microcavity 28. The intermediate electrode 38 is deposited such that it covers the overhang of the filler layer 16a, 16b to form an overhang region 58 and connects to the bottom first electrode 30 to form a connecting area 40 thereby forming an electrical contact between the bottom first electrode 30 and the intermediate electrode 38. The connection (the overhang region 58 and the connecting area 40) between the bottom first electrode 30 and the intermediate electrode 38 can be made with the same material, or any other conductive material, such as, for example, TCO. This connection formed by the connecting area 40 removes the requirement for reconsiderations of electron-hole charge balancing requirements for all material types and thicknesses of the layers of the OLED stack 42 when tuning the optical microcavity 28 by altering the optical path length of the microcavity. This is advantageous in that organic layer designs need not be altered to balance the charge of the OLED stack 42, and the filler layer 16a, 16b individual or combined thickness may be adjusted to alter the optical path length of the optical microcavity 28. The bottom first electrode 30 may be an anode or a cathode, therefore the OLED device may be a conventional configuration or an inverted configuration. A conventional OLED configuration is one such that the bottom first electrode 30 before the OLED stack 42 is an anode and the top electrode 18 above the OLED stack 42 is a cathode. For inverted OLEDs, the bottom first electrode 30 before the OLED stack 42 is a cathode and the top electrode 18 above the OLED stack 42 is an anode.

Figure 4:
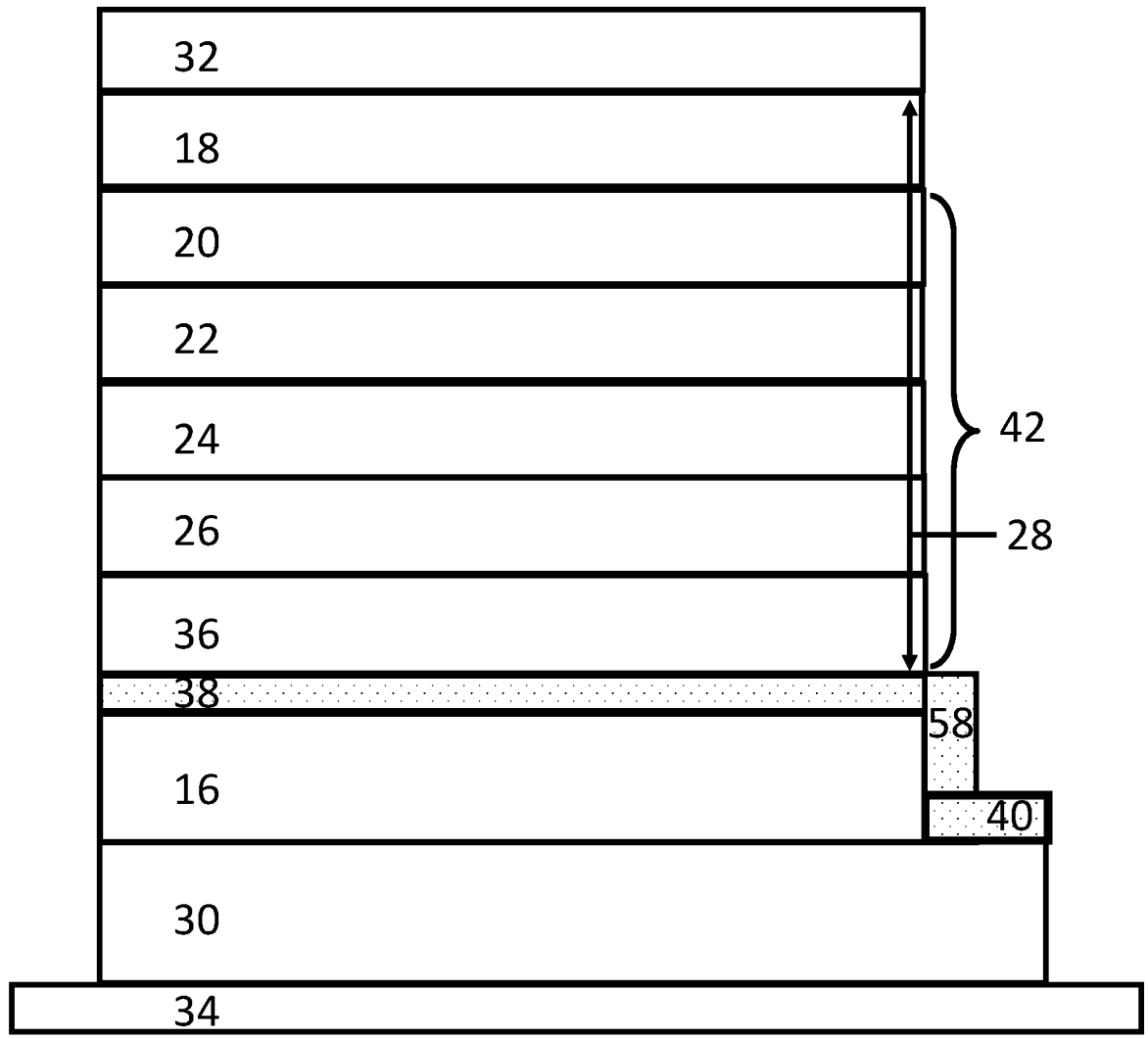
FIG. 4: illustrates an embodiment of a MCOLED as per the present disclosure including a reflective surface deposited on the top electrode to form the optical microcavity of the MCOLED.

FIG. 4 illustrates an embodiment of a microcavity OLED device as disclosed herein. The MCOLED device has a bottom first electrode 30 deposited on a substrate 34. A filler layer 16 is then deposited on the bottom first electrode 30. A semi-transparent or transparent intermediate electrode 38 is then deposited on top of the filler layer 16. The OLED stack 42 is then deposited on top of the intermediate electrode 38. In this embodiment, the OLED stack 42 includes an EIL 36, ETL 26, EML 24, HTL 22, and a HIL 20. A top electrode 18 is then deposited on the OLED stack 42 and an additional reflective surface 32 is deposited on top of the top electrode 18 to form an optical microcavity 28. The intermediate electrode 38 is deposited such that it covers the overhang of the filler layer 16 to form an overhang region 58 and connects to the bottom first electrode 30 to form a connecting area 40 thereby forming an electrical contact between the bottom first electrode 30 and the intermediate electrode 38. This connection formed by the connecting area 40 removes the requirement for reconsiderations of electron-hole charge balancing requirements for all material types and thicknesses of the layers of the OLED stack 42 when tuning the optical microcavity 28 by altering the optical path length of the microcavity. This is advantageous in that organic layer designs need not be altered to balance the charge of the OLED stack 42, and the filler layer 16 thickness alone may be adjusted to alter the optical path length of the optical microcavity 28.

Figure 5:
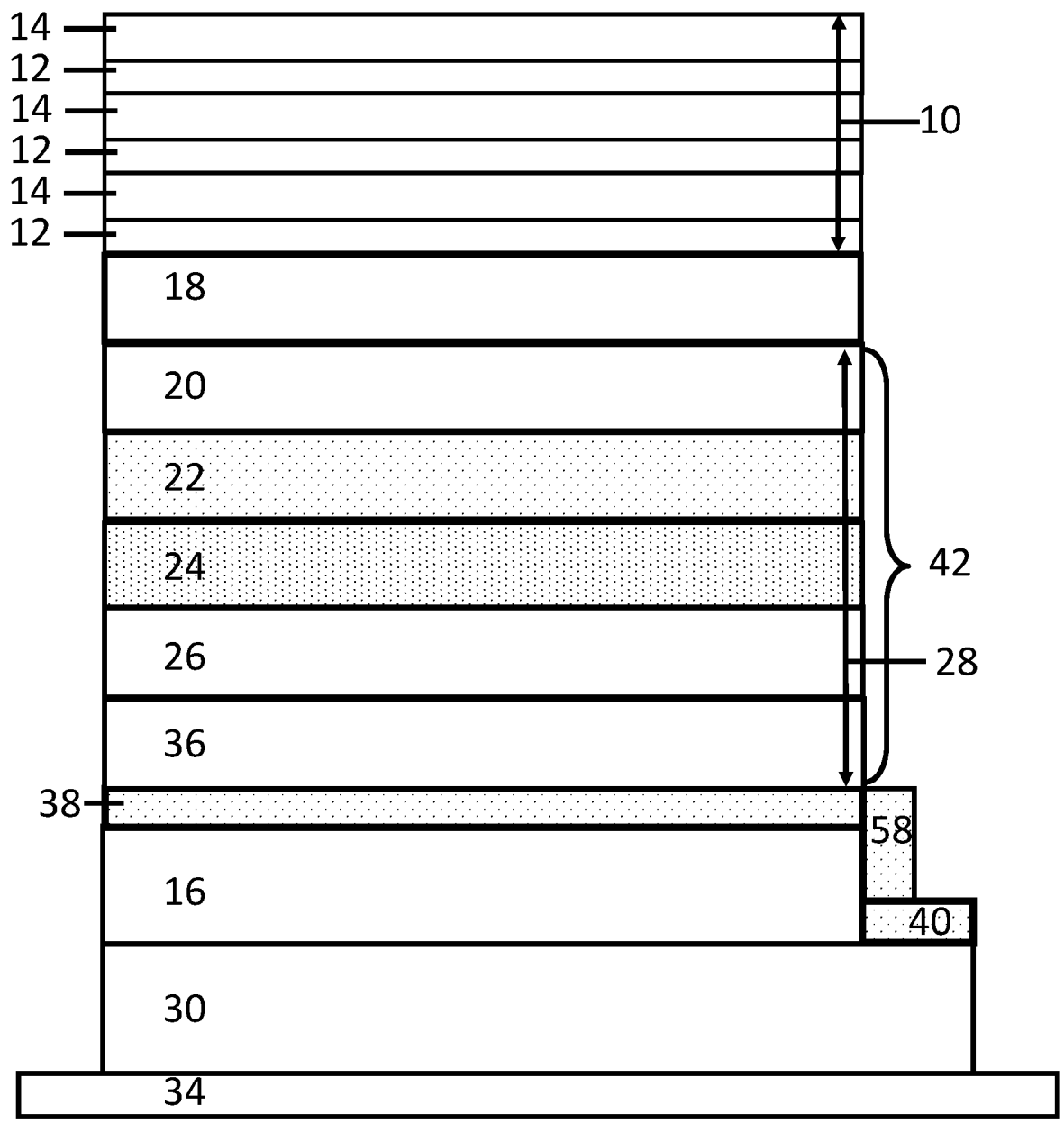
FIG. 5: illustrates an alternative embodiment of a MCOLED as per the present disclosure in which a distributed Bragg reflector (DBR) is deposited on top of the top electrode.

FIG. 5 illustrates an embodiment of a microcavity OLED device as disclosed herein. The MCOLED device has a bottom first electrode 30 deposited on a substrate 34. A filler layer 16 is then deposited on the bottom first electrode 30. A semi-transparent or transparent intermediate electrode 38 is then deposited on top of the filler layer 16. The OLED stack 42 is then deposited on top of the intermediate electrode 38. In this embodiment, the OLED stack 42 includes an EIL 36, ETL 26, EML 24, HTL 22, and a HIL 20. A top electrode 18, which in this embodiment is a transparent or semi-transparent electrode, is then deposited on the OLED stack 42 and a distributed Bragg reflector (DBR) 10 positioned on top of the top electrode 18. The DBR 10 consists of a series of alternating layers of high refractive index dielectric material 14 and low refractive index dielectric material 12. The DBR 10 acts as the second reflective surface for the optical microcavity 28. The intermediate electrode 38 is deposited such that it covers the overhang of the filler layer 16 to form an overhang region 58 and connects to the bottom first electrode 30 to form a connecting area 40 thereby forming an electrical contact between the bottom first electrode 30 and the intermediate electrode 38. This connection formed by the connecting area 40 removes the requirement for electron-hole charge balancing reconsiderations for all material types and thicknesses of the layers of the OLED stack 42 when adjusting the length of the optical microcavity 28 during the tuning process. This may now be achieved through altering the filler layer 16 thickness alone without the need for rebalancing of the electron-hole charges within the OLED stack 42. The intermediate electrode 38 is a transparent conductive oxide such as, for example Indium Tin Oxide (ITO), Fluorine Doped Tin Oxide (FTO), Aluminum-doped Zinc Oxide (AZO), Indium-doped Zinc Oxide (IZO), Gallium-doped Zinc Oxide (ZnO), or a semitransparent thin metal film such as Ag, Al, Ag, Ca, Li, Au and Ag:Mg alloy etc. It can also be single film or multi-layer film such as, for example, Ag/Al, Li/Al, and Ca/Ag.

Figure 6A:
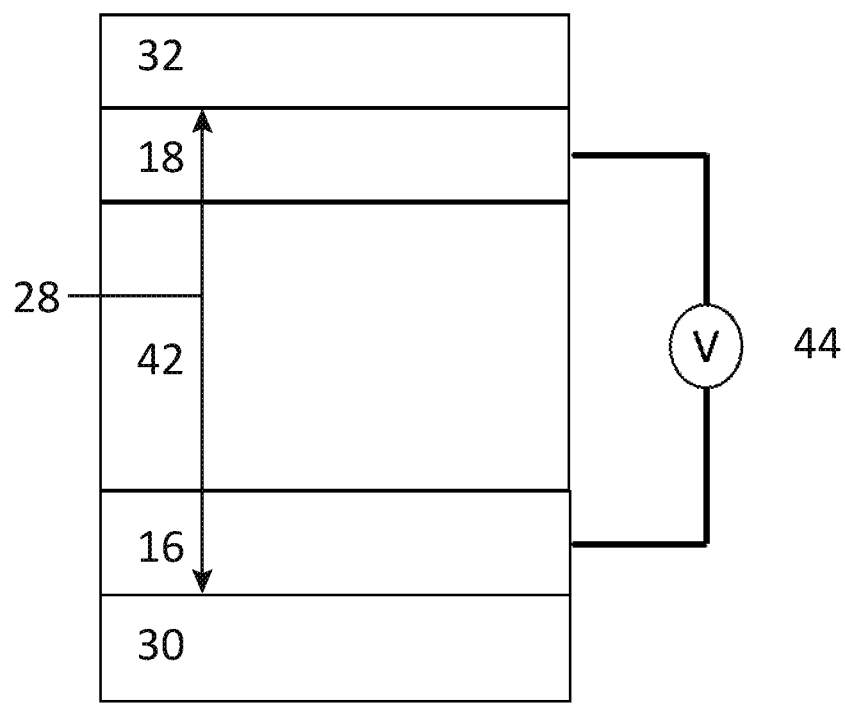
FIG. 6A: illustrates the voltage connections of MCOLED structures known in the art.

FIG. 6A illustrates the electrical connection 44 between two electrodes in an OLED device, the two electrodes being the bottom first electrode 30 and the top electrode 18 as disclosed in U.S. Pat. No. 7,023,013. The filler layer 16 is positioned between the bottom first electrode 30 and top electrode 18, and an additional reflective surface 32 is layered on top of the top electrode which with the bottom first electrode forms an optical microcavity 28. Electron-hole charge balancing requirements must be considered in material and layer thickness alternation in the OLED stack 42 layers during the tuning process for this OLED device. The tuning process refers to changing the optical path length of a microcavity to the optimum dimension for desired output.

Figure 6B:
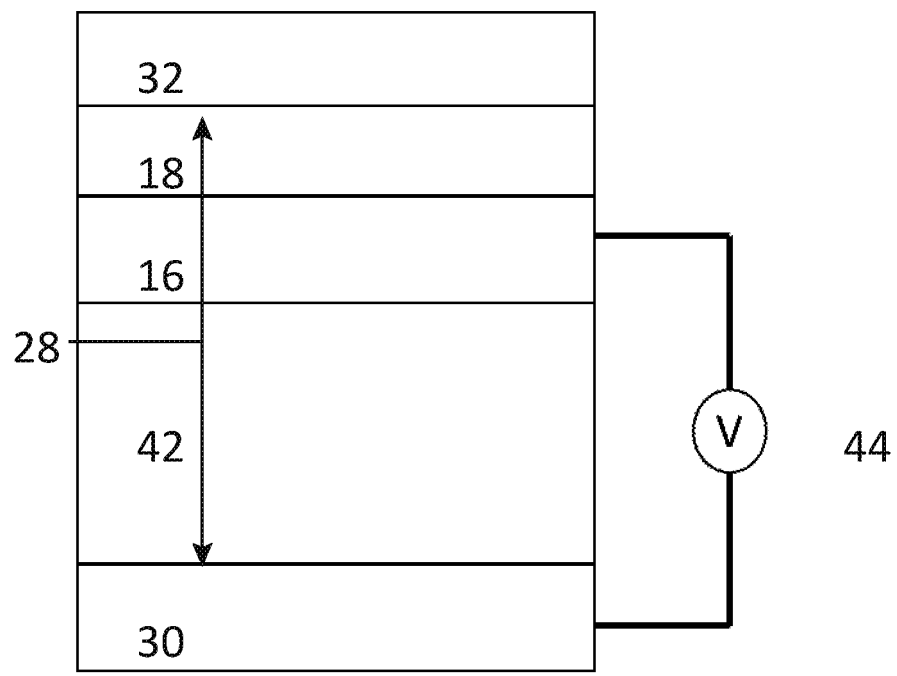
FIG. 6B: illustrates the voltage connections of MCOLED structures known in the art.
Figure 7:
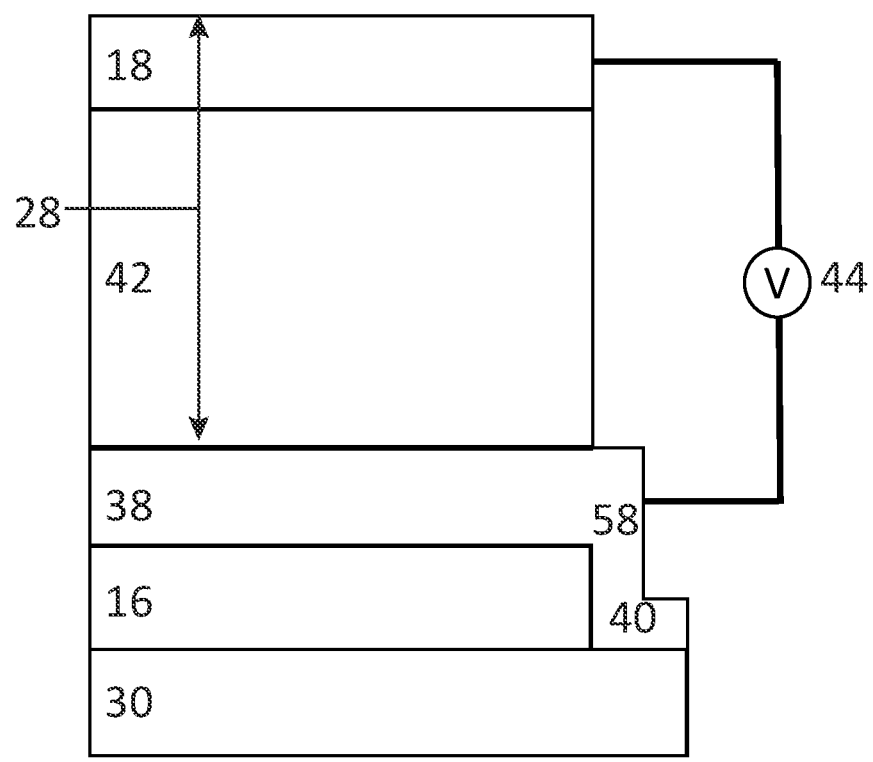
FIG. 7: illustrates the voltage connections of MCOLED structure of the present disclosure.

FIG. 6B illustrates the electrical connection 44 between two electrodes in an OLED device, the two electrodes being the bottom first electrode 30 and the top electrode 18 as disclosed in U.S. Pat. No. 10,340,480. The filler layer 16 is positioned between the OLED stack 42 and top electrode 18 and additional reflective surface 32 is layered on top of the top electrode which with the bottom first electrode which forms an optical microcavity 28. In this device electron-hole charge balancing requirements must be considered in material and layer thickness alternation in the OLED stack 42 layers during the tuning process FIG. 7 illustrates the electrical connection 44 between two electrodes in an OLED device as per the present disclosure. The electrical connection 44 as shown in this figure is formed between the bottom first electrode 30 and an intermediate electrode 38 by way of an overhang region 58 in the intermediate electrode which connects through connecting area 40. The filler layer 16 is positioned between the bottom first electrode 30 and the intermediate electrode 38 and the OLED stack 42 is positioned above the intermediate electrode 38 therefore removing electron-hole charge balancing reconsideration within the OLED stack 42 during the tuning process. In this embodiment, the top electrode 18 acts as a reflective surface to form the optical microcavity 28. An advantage of the intermediate electrode 38 having overhang region 58 is that in the optimization of the optical path length of the optical microcavity 28 of the device the thickness of the filler layer 16 may be adjusted to achieve the required optical path length without impacting the charge balance within the layers of the OLED stack 42.

Figure 8:
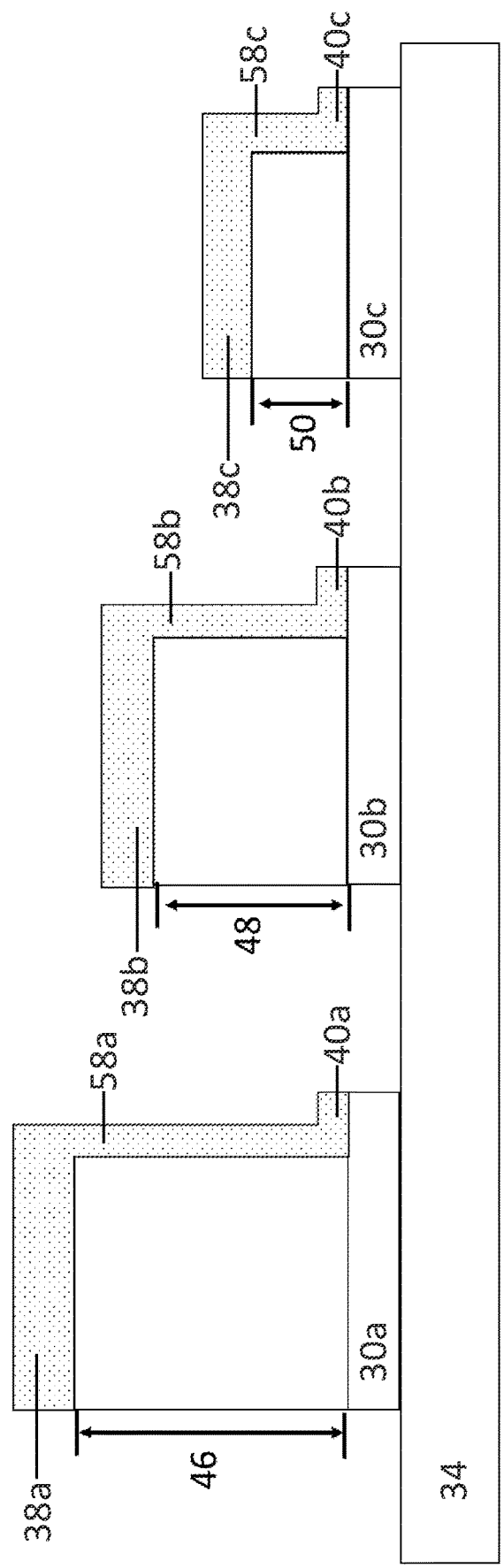
FIG. 8: illustrates adjusting the filler layer of a MCOLED thereby adjusting the microcavity for red, green, and blue MCOLED structures.

FIG. 8 illustrates an array of RGB (red, green, and blue) microcavity OLED structures on a single substrate 34. This figure highlights the varying thickness of the filler layer required for tuning each individual color MCOLED. Each structure has a bottom first series of electrodes 30a, 30b, 30c, and a filler layer for red color 46, a filler layer for green color 48, or a filler layer for blue color 50 is then deposited on the bottom first series of electrodes 30a, 30b, 30c, respectively. The varying thicknesses required to achieve the optical path length required for each color, therefore each filler layer 46, 48, 50 must be deposited separately. The intermediate series of electrodes 38a, 38b, 38c are then deposited on the filler layers 46, 48, 50 respectively. As shown, intermediate series of electrodes 38a, 38b, 38c have an overhang region 58a, 58b, 58c and connecting area 40a, 40b, 40c to electrically connect the intermediate series electrodes 38a, 38b, 38c to the bottom first series electrodes 30a, 30b, 30c, respectively, and the color of the OLED structure is provided by the difference in thickness of the filler layer therebetween. The intermediate series of electrodes 38a, 38b, 38c are deposited on top of the entirety of the top surface of filler layers 46, 48, 50 and extend beyond the top surface of said filler layers 46, 48, 50, thereby forming the overhang regions 58a, 58b, 58c. The overhang regions 58a, 58b, 58c extend to connect with the bottom first series of electrodes 30a, 30b, 30c of each OLED. The connecting area 40a, 40b, 40c is formed by the intermediate series of electrodes 38a, 38b, 38c being deposited over top of the exposed bottom first series of 30a, 30b, 30c to form an electrical connection between the two layers.

Figure 9:
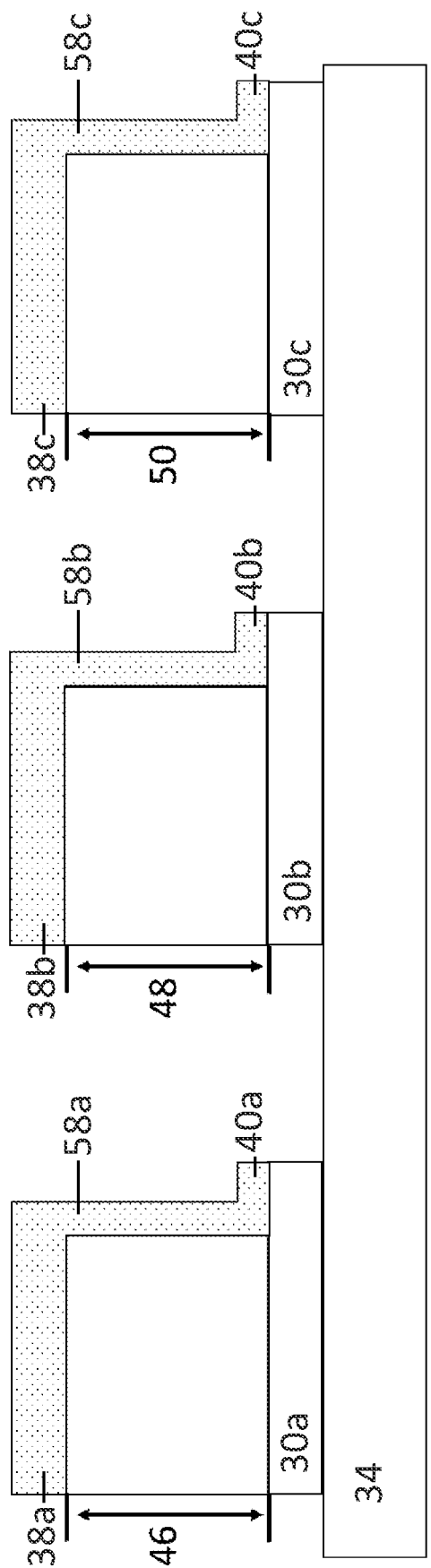
FIG. 9: illustrates fillers layers of an R, G, B MCOLED array wherein the filler layers are of similar or same thickness.

FIG. 9 illustrates an array of RGB (red, green, and blue) microcavity OLED structures on a single substrate 34. In this embodiment, the thickness of each filler layer required for tuning each individual color MCOLED may be similar or the same to one another if the material is varied to accommodate the structure of each individual color. Each structure has a bottom first series of electrodes 30a, 30b, 30c. Then a filler layer for red color 46, a filler layer for green color 48, or a filler layer for blue color 50 is deposited on the bottom first series of electrodes 30a, 30b, 30c, respectively. Depending on the properties of each selected filler layer 46, 48, 50 material, the thickness of filler layers 46, 48, 50 may be similar or equal. The intermediate series of electrodes 38a, 38b, 38c are then deposited on the filler layers 46, 48, 50, respectively. As shown, intermediate series of electrodes 38a, 38b, 38c have an overhang region 58a, 58b, 58c and connecting area 40a, 40b, 40c to electrically connect the intermediate series of electrodes 38a, 38b, 38c to the bottom first series of electrodes 30a, 30b, 30c, respectively. The intermediate series of electrodes 38a, 38b, 38c are deposited on top of the entirety of the top surface of filler layers 46, 48, 50 and extend beyond the top surface of said filler layers 46, 48, 50, thereby forming the overhang regions 58a, 58b, 58c. The overhang regions 58a, 58b, 58c extend to connect with the bottom first series of electrodes 30a, 30b, 30c of each OLED. The connecting area 40a, 40b, 40c is formed by the intermediate series of electrode(s) 38a, 38b, 38c being deposited over top of the exposed bottom first series of electrodes 30a, 30b, 30c to form an electrical connection between the two layers.

Vertical-Cavity Surface-Emitting Lasers (VCSELs)

As stated previously, a vertical-cavity surface-emitting laser (VCSEL) refers to a semiconductor-based laser diode that emits light or optical beam vertically from its top surface. This orientation is more advantageous than the Edge Emitting Lasers (EEL) that emits light from the side or from the Light Emitting Diodes (LED) that produce light from the sides and top, at least because as VCSELs discharge light perpendicular to the surface of a laser, thousands of VCSELs can be processed all at one time in a wafer. The performance of a VCSEL device can be quantified by a dimensionless parameter known as a Q factor. Similar to the MCOLED devices described previously, the addition of an intermediate cathode in a VCSEL device alleviates charge balancing reconsiderations in tuning the optical cavity of the device, the filler layer thickness is the variable that is to be changed to achieve the desired optical path length.

Figure 10:
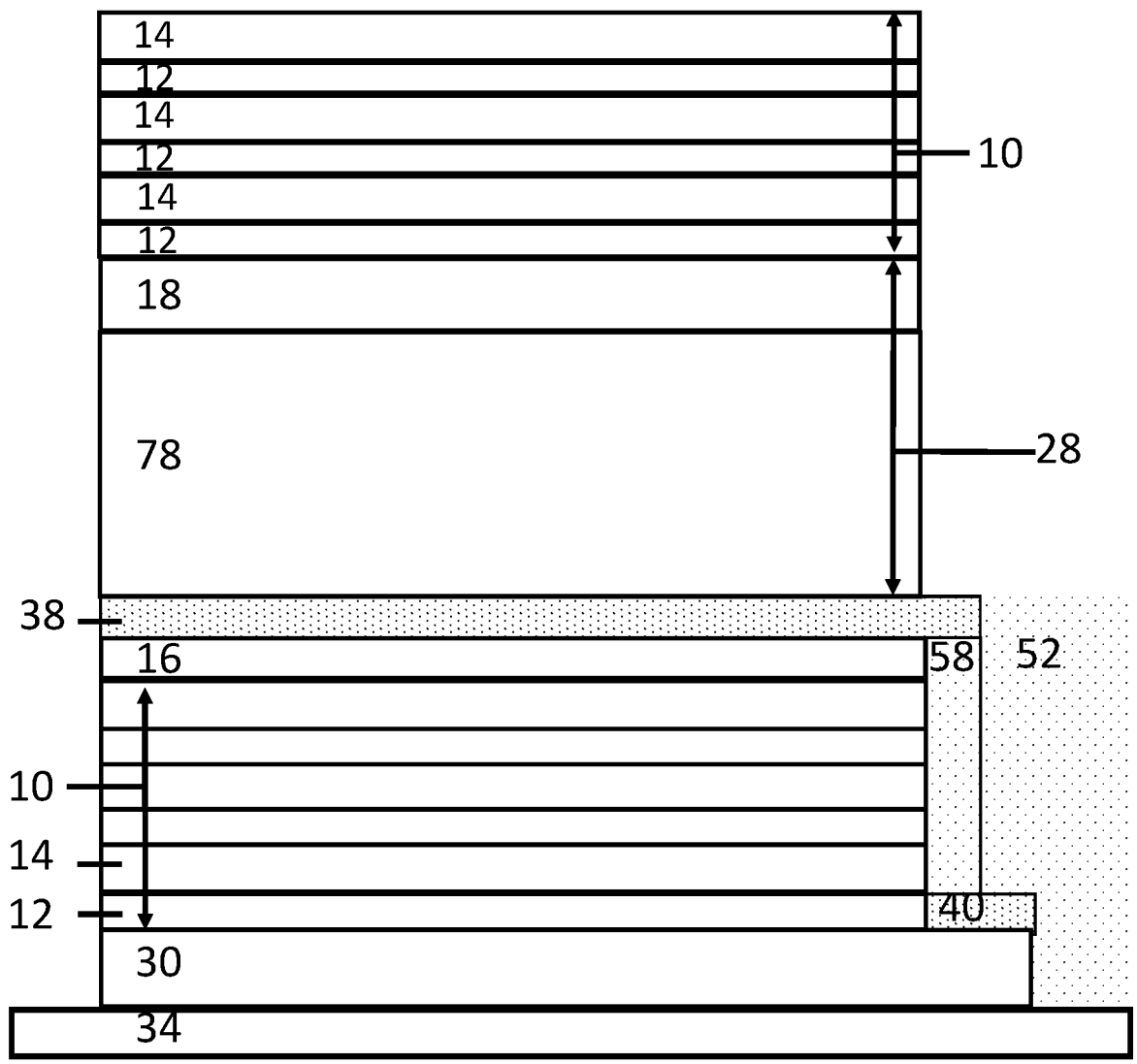
FIG. 10: illustrates a vertical-cavity surface-emitting laser (VCSEL) device as per the present disclosure.

FIG. 10 illustrates a VCSEL device consisting of a bottom first electrode 30 deposited on a substrate 34. A DBR 10 is deposited on top of the substrate which consists of a series of alternating layers of low refractive index dielectric material 12 and high refractive index dielectric material 14. A filler layer 16 is deposited on the first DBR and an intermediate electrode 38 is deposited such that it covers the overhang of the filler layer 16 to form an overhang region 58 and connects to the bottom first electrode 30 to form a connecting area 40 thereby forming an electrical contact between the bottom first electrode 30 and the intermediate electrode 38. This connection formed by the connecting area 40 removes the requirement for electron-hole charge balancing reconsiderations for all material types and thicknesses of the layers of the standard light emitting stack 78 deposited on top of the intermediate electrode 38 when adjusting the length of the optical microcavity 28 during the tuning process. A top electrode 18 is deposited on the light emitting stack 78 and a second DBR 10 is deposited on top of the substrate which is comprised of a series of alternating layers of low refractive index dielectric material 12 and high refractive index dielectric material 14 and acts as the second reflective surface to form the optical microcavity 28 of the VCSEL. Pixel definition layer (PDL) 52 is deposited such that it covers the overhang region 58 of the intermediate electrode 38 and the connecting area 40 but does not cover the active area of the filler layer 16.

Microcavity OLED Fabrication Method and Considerations

Fabrication of microcavity OLED devices suitable for light field display technology is inherently complicated due the pixel size required to achieve the desired resolution for a high-quality display. FIGS. 11A-H illustrate a step by step process of fabricating a MCOLED structure as per the present disclosure.

Figure 11G:
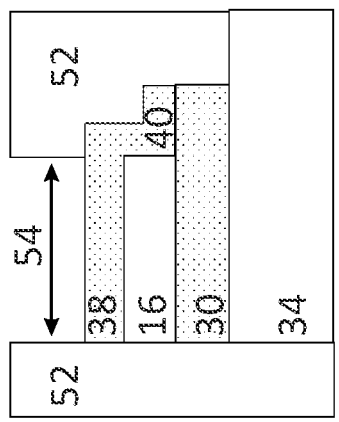
FIG. 11G: illustrates a side view of the proposed MCOLED patterning process for depositing the bottom first and intermediate electrodes with color adjusted filler layer.
Figure 11H:
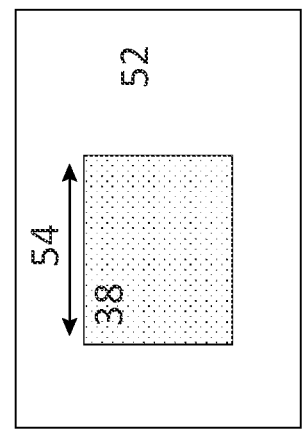
FIG. 11H: illustrates a top view of step 4 of the proposed MCOLED patterning process for depositing the bottom first and intermediate electrodes with color adjusted filler layer.
Figure 11E:
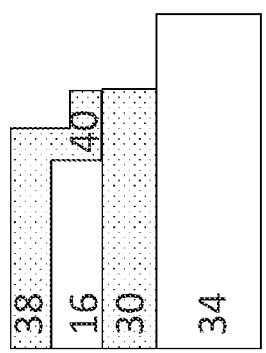
FIG. 11E: illustrates a side view of step 3 of the proposed MCOLED patterning process for depositing the bottom first and intermediate electrodes with color adjusted filler layer.
Figure 11F:
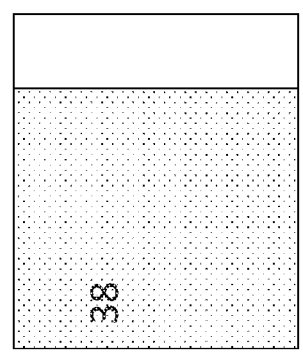
FIG. 11F: illustrates a top view of step 3 of the proposed MCOLED patterning process for depositing the bottom first and intermediate electrodes with color adjusted filler layer.
Figure 11C:
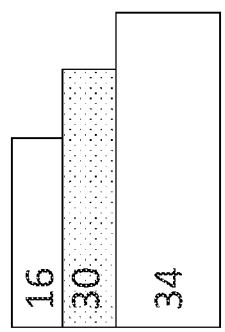
FIG. 11C: illustrates a side view of step 2 of the proposed MCOLED patterning process for depositing the bottom first and intermediate electrodes with color adjusted filler layer.
Figure 11D:
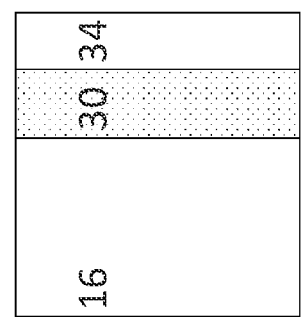
FIG. 11D: illustrates a top view of step 2 of the proposed MCOLED patterning process for depositing the bottom first and intermediate electrodes with color adjusted filler layer.
Figure 11A:
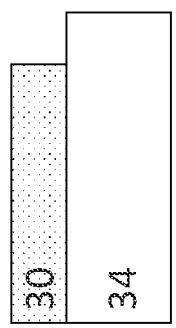
FIG. 11A: illustrates a side view of step 1 of the proposed MCOLED patterning process for depositing the bottom first and intermediate electrodes with color adjusted filler layer.
Figure 11B:
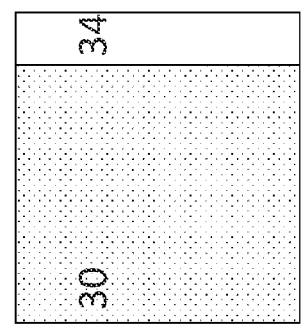
FIG. 11B: illustrates a top view of step 1 of the proposed MCOLED patterning process for depositing the bottom first and intermediate electrodes with color adjusted filler layer.

FIG. 11A-B illustrates a side and top view, respectively, of a bottom first electrode 30 deposited on a substrate 34.

FIG. 11C-D illustrates a side and top view, respectively, of a filler layer 16 (for a single color) deposited on the bottom first electrode 30, which is on a substrate 34.

FIG. 11E-F illustrates a side and top view, respectively, an intermediate electrode 38 deposited such that it covers the overhang of the filler layer 16 to connect to the bottom first electrode 30 to form a connecting area 40 thereby forming a contact between the bottom first electrode 30 and the intermediate electrode 38. As per an embodiment of the present disclosure, FIG. 11G-H illustrate a side and top view, respectively, of the deposition of a pixel definition layer (PDL) 52 deposited on the bottom first electrode 30 and substrate 34. The PDL 52 is deposited such that it covers the overhang portion of the intermediate electrode 38 and the connecting area 40 but does not cover the active area 54 of the filler layer 16 to allow for the subsequent deposition of an OLED stack. The pixel definition layer (PDL) may be composed of an inorganic material such as an insulting dielectric, for example $Si_3N_4$ or $SiO_2$, or an organic material such as, for example, a photosensitive polyimide. The PDL 52 can be deposited by, for example, physical vapor deposition (PVD) such as thermal evaporation, electron-beam evaporation, sputtering, or by chemical vapor deposition (CVD) methods such as atomic layer deposition.

Figure 12:
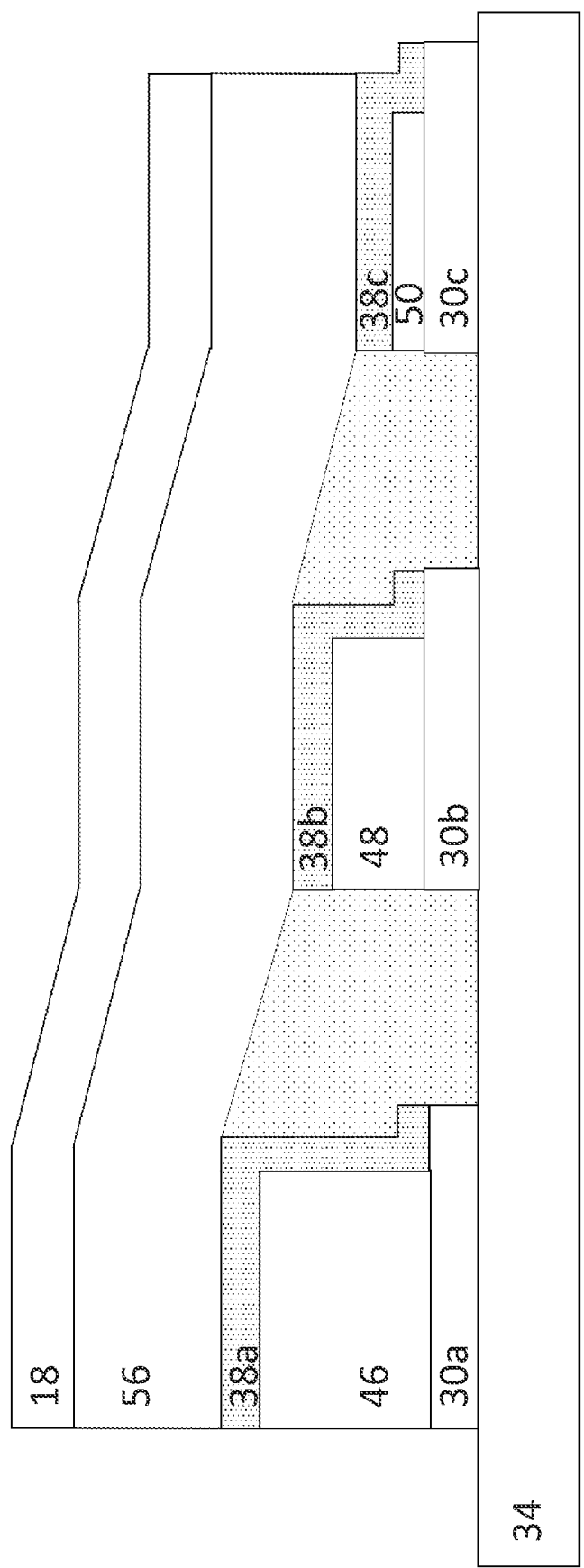
FIG. 12: illustrates a side view of a multi-color MCOLED array with white OLED layer.

FIG. 12 illustrates a side view of a multi-color MCOLED array with white OLED stack 56. The method of fabricating this embodiment includes a bottom first series of electrodes 30a, 30b, 30c deposited on a single substrate 34. The electrodes can be deposited by, for example, physical vapor deposition (PVD) such as thermal evaporation, electron-beam evaporation, sputtering, or by chemical vapor deposition (CVD) methods such as atomic layer deposition. Each structure in the MCOLED array has a filler layer deposited separately for each of red, green and blue, deposited as a filler layer for red color 46, a filler layer for green color 48, and a filler layer for blue color 50. Each filler layer can be deposited by physical vapor deposition (PVD) such as thermal evaporation, electron-beam evaporation, sputtering or chemical vapor deposition (CVD) methods such as atomic layer deposition or Plasma-enhanced chemical vapor deposition (PECVD), or by spin coating. An intermediate series of electrodes 38a, 38b, and 38c can be deposited by way of by physical vapor deposition (PVD) such as thermal evaporation, electron-beam evaporation, sputtering; or chemical vapor deposition (CVD) methods such as atomic layer deposition on the RGB filler layers 46, 48, and 50 and forms a connection with each of the bottom first series of electrodes 30a, 30b, 30c. The connection formed between the bottom first electrode and 30 and the intermediate electrode 38 now allows for blanket deposition of a common white OLED stack 56. This is advantageous in that the white OLED stack 56 may be easily deposited over all devices in the array, regardless of color. The top electrode 18 is also able to be deposited using blanket deposition technique over the common white OLED stack 56.

Theoretical Design Variables

When a light emitting material is placed between two reflective surfaces, the spontaneous-emission photon density of states is redistributed, resulting in an enhancement of emission intensity in the perpendicular direction as well as in narrowing of the emission spectra [Ref. 07]. This enhancement occurs when the total optical path length, Li, satisfies the relationship: [Ref 02]

$$L_i = \frac{m\lambda_i}{2} \quad (1)$$

where m is a positive integer and $\lambda_i$ is the wavelength of peak emission from the cavity [Ref. 03].

Emission Characteristics

The reduced angular spread due to the microcavity can be approximated as $$\delta\theta_{FWHM} = \sqrt{\frac{2\lambda_i(1 - \sqrt{R_{Cathode}R_{DBR}})}{\pi L_i \sqrt[4]{R_{Cathode}R_{DBR}}}} \quad (2)$$

Similarly, the FWHM of the output spectrum is determined as:

$$\delta\lambda_{FWHM} = \sqrt{\frac{2\lambda_i^2(1 - \sqrt{R_{Cathode}R_{DBR}})}{\pi L_i \sqrt[4]{R_{Cathode}R_{DBR}}}} \quad (3)$$

where $R_{cathode}$ is the reflectance of the cathode, and $R_{DBR}$ is the reflectance of the DBR.

Distributed Bragg Reflector

The highest reflectivity of the DBR structure is attained when the layer thicknesses, $d_i$, are chosen such that the optical path length of each layer is one quarter of the resonance wavelength, or:

$$d_i = \frac{\lambda_{Bragg}}{4n} \quad (4)$$

where $\lambda_{Bragg}$ is the design wavelength for the DBR, which can be any value but is chosen such that the reflectance is high in the wavelength range for the design [Ref 06]. Under these conditions, all reflections will add in phase, and the transmissivity will decrease exponentially as a function of mirror thickness. The reflectance of a DBR at $\lambda_{Bragg}$ can be approximated as:

$$R_{DBR} = \left(\frac{1 - \left(\frac{n_1}{n_2}\right)^{2\Lambda}}{1 + \left(\frac{n_1}{n_2}\right)^{2\Lambda}}\right)^2 \quad (5)$$

where $n_1$ is the refractive index of the low index DBR at $\lambda_{Bragg}$, $n_2$ is the refractive index of the high index DBR material at $\lambda_{Bragg}$, and $\Lambda$ is the number of dielectric pairs [Ref 05]. At longer or shorter wavelengths, the reflections begin to add out of phase, therefore the total reflections decrease [Ref. 01]. The result is a broad-band high-reflectivity region centered on $\lambda_{Bragg}$ referred to as the stop band, $\delta\lambda_{Sb}$ determined as:

$$\delta\lambda_{sb} = 2\frac{\lambda_{Bragg}(n_2 - n_1)}{\pi n_{\textit{eff}}} \quad (6)$$

where $n_{\textit{eff}}$ is the effective index [Ref. 04]. These are the theoretical design variables considered in the prior art for a microcavity OLED structure with a DBR, and similarly in the present disclosure. To enhance the output of the MCOLED and the MCOLED design, the present disclosure considers the optical path length of the microcavity. The materials of the DBR can be any material which are not opaque in the wavelength range of the design. For example, in the visible wavelength range, materials such as silicon nitride, titanium dioxide, silicon dioxide, and other dielectrics may be used.

Optical Path Length

The total optical path length of the microcavity is represented as:

$$L_i = L_{DBR} + L_{Organics} L_{Cathode} \quad (7)$$

where $L_{DBR}$ is the penetration depth into the DBR, $L_{Organics}$ is the optical path length in the OLED materials, and $L_{Cathode}$ is the penetration depth into the metal cathode. The optical path length in the materials between the two reflective surfaces is found as the sum of the optical path lengths in each material:

$$L_{Organics} = \sum_i^N n_i d_i \quad (8)$$

where $n_i$ and $d_i$ are the layer indices and thicknesses, respectively. The penetration depth into the DBR can be determined as [Ref 02, 08]:

$$L_{DBR} = \frac{\lambda_{Bragg}}{2} \frac{n_{eff}}{(n_2 - n_1)} \quad (9)$$

and the penetration depth into the metal cathode is:

$$L_{Cathode} = \left| \frac{\Phi_m}{4\pi} \lambda_i \right| \quad (10)$$

where $\Phi_m$ is the phase shift at the metal reflector, given by:

$$\Phi_m = \tan^{-1}\left( \frac{2 n_{Cavity} k_{Cathode}}{n_{Cavity}^2 - n_{Cathode}^2 - k_{Cathode}^2} \right) \quad (11)$$

where $n_{Cavity}$ is the refractive index of the organic in contact with the cathode, and $n_{Cathode}$ and $k_{Cathode}$ are the real and imaginary parts of the refractive index of the metal cathode [Ref. 02].

Figure 16A:
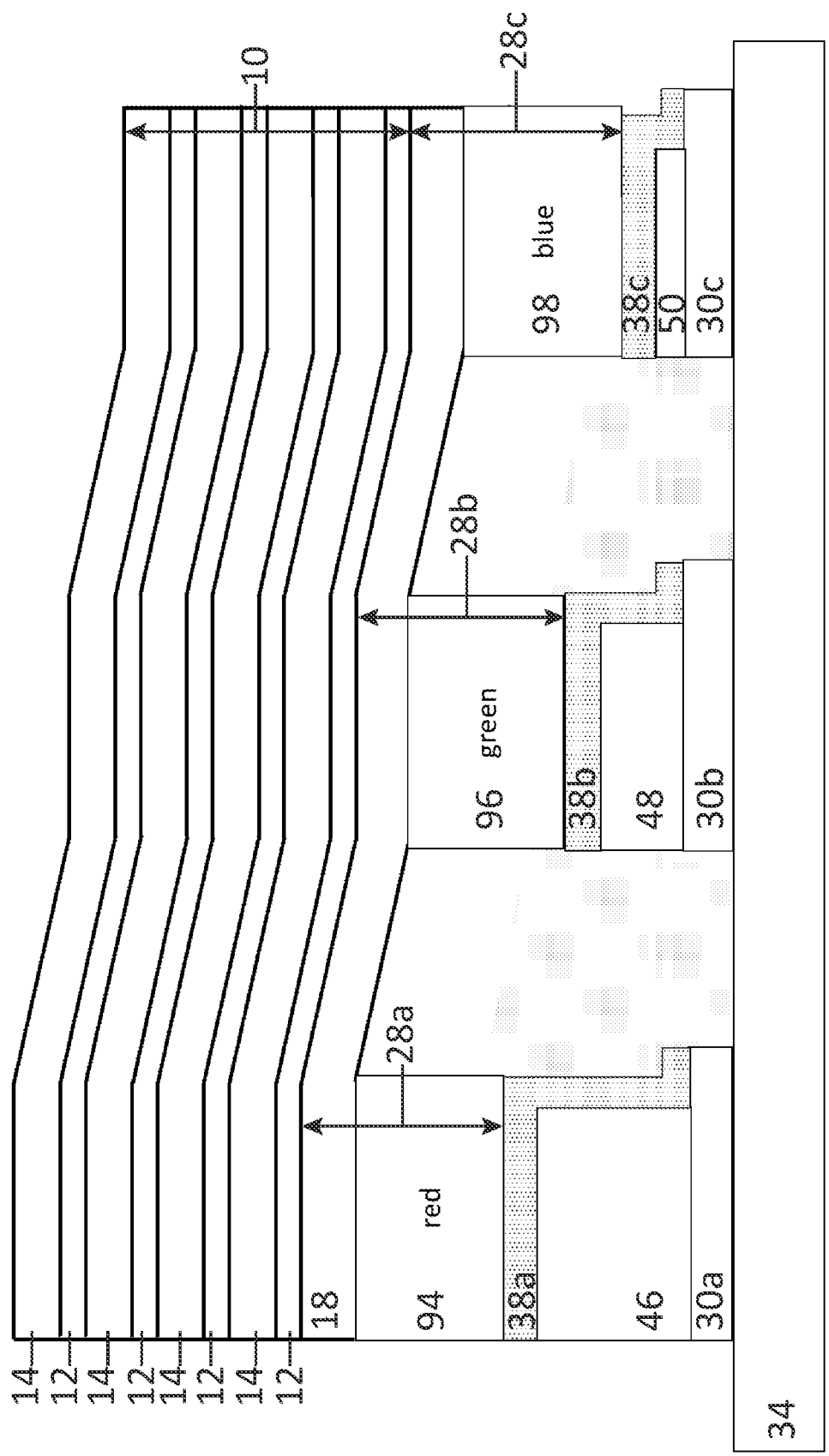
FIG. 16A: illustrates a side view of a multi-color MCOLED with a common distributed Bragg reflector (DBR) structure.

FIG. 16A illustrates a side view of a multi-color MCOLED array with Red OLED stack 94, Green OLED stack 96, and Blue OLED stack 98 with a common shared distributed Bragg reflector 10. The method of fabricating this embodiment includes bottom first series of electrodes 30a, 30b, 30c deposited on a single substrate 34. The electrodes can be deposited by, for example, physical vapor deposition (PVD) such as thermal evaporation, electron-beam evaporation, sputtering, or by chemical vapor deposition (CVD) methods such as atomic layer deposition. Each structure in the MCOLED array has a filler layer deposited separately for each of red, green and blue, deposited as a filler layer for red color 46, a filler layer for green color 48, and a filler layer for blue color 50. Each filler layer can be deposited by physical vapor deposition (PVD) such as thermal evaporation, electron-beam evaporation, sputtering or chemical vapor deposition (CVD) methods such as atomic layer deposition or Plasma-enhanced chemical vapor deposition (PECVD), or by spin coating. An intermediate series of electrodes 38a, 38b, and 38c can be deposited by way of by physical vapor deposition (PVD) such as thermal evaporation, electron-beam evaporation, sputtering; or chemical vapor deposition (CVD) methods such as atomic layer deposition on the RGB filler layers 46, 48, and 50 and forms a connection with each of the bottom first series of electrodes 30a, 30b, 30c. In this embodiment, individual OLED stacks for each color, specifically Red OLED stack 94, Green OLED stack 96, and Blue OLED stack 98, are deposited separately. In this embodiment, the top electrode 18 is deposited using blanket deposition technique over the individual R, G, B OLED stacks 94, 96, 98. The top electrode 18 may also be individually deposited on top of each individual R, G, B OLED stacks 94, 96, 98. A common distributed Bragg reflector (DBR) 10 is then deposited on top of the top electrode 18 to form the optical microcavities 28a, 28b, 28c. The DBR 10 consists of a series of alternating layers of high refractive index dielectric material 14 and low refractive index dielectric material 12. The DBR 10 acts as the second reflective surface for the optical microcavities 28a, 28b, 28c.

Figure 16B:
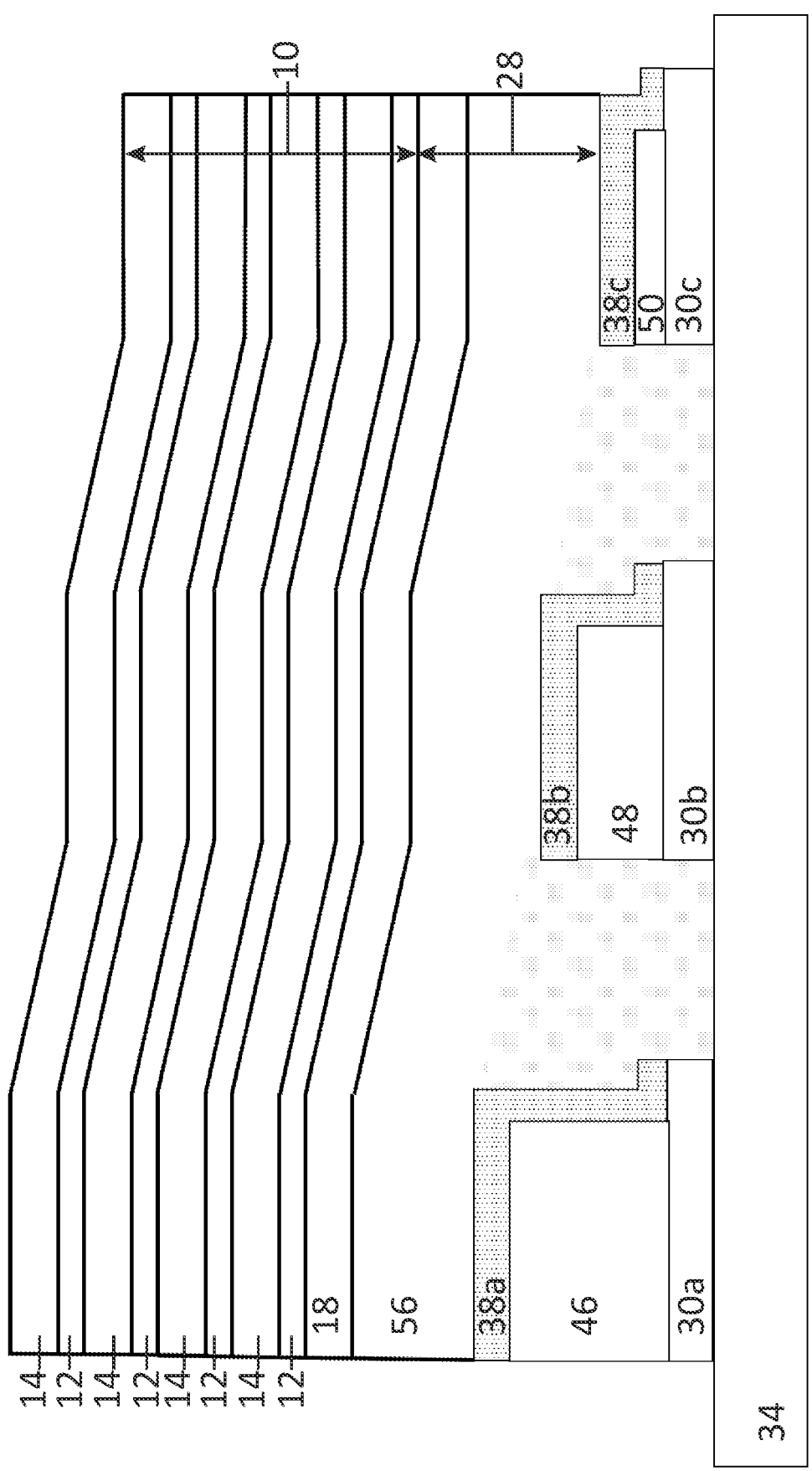
FIG. 16B: illustrates a side view of an alternative embodiment of a multi-color MCOLED with a common distributed Bragg reflector (DBR) structure.

As shown in FIG. 16B illustrates a side view of a multi-color MCOLED array with white OLED stack 56. The method of fabricating this embodiment includes a bottom first series of electrodes 30a, 30b, 30c deposited on a single substrate 34. The electrodes can be deposited by, for example, physical vapor deposition (PVD) such as thermal evaporation, electron-beam evaporation, sputtering, or by chemical vapor deposition (CVD) methods such as atomic layer deposition. Each structure in the MCOLED array has a filler layer deposited separately for each of red, green and blue, deposited as a filler layer for red color 46, a filler layer for green color 48, and a filler layer for blue color 50. Each filler layer can be deposited by physical vapor deposition (PVD) such as thermal evaporation, electron-beam evaporation, sputtering or chemical vapor deposition (CVD) methods such as atomic layer deposition or Plasma-enhanced chemical vapor deposition (PECVD), or by spin coating. An intermediate series of electrodes 38a, 38b, and 38c can be deposited by way of by physical vapor deposition (PVD) such as thermal evaporation, electron-beam evaporation, sputtering; or chemical vapor deposition (CVD) methods such as atomic layer deposition on the RGB filler layers 46, 48, and 50 and forms a connection with each of the bottom first series of electrodes 30a, 30b, 30c. The connection formed between the bottom first electrode and 30 and the intermediate series of electrodes 38a, 38b, 38c now allow for blanket deposition of a common white OLED stack 56. This is advantageous in that the white OLED stack 56 may be easily deposited over all devices in the array, regardless of color. The top electrode 18 is also able to be deposited using blanket deposition technique over the common white OLED stack 56. A common distributed Bragg reflector (DBR) 10 is then deposited on top of the top electrode 18 to form the optical microcavity 28. The DBR 10 consists of a series of alternating layers of high refractive index dielectric material 14 and low refractive index dielectric material 12. The DBR 10 acts as the second reflective surface for the optical microcavity 28.

Figure 13:
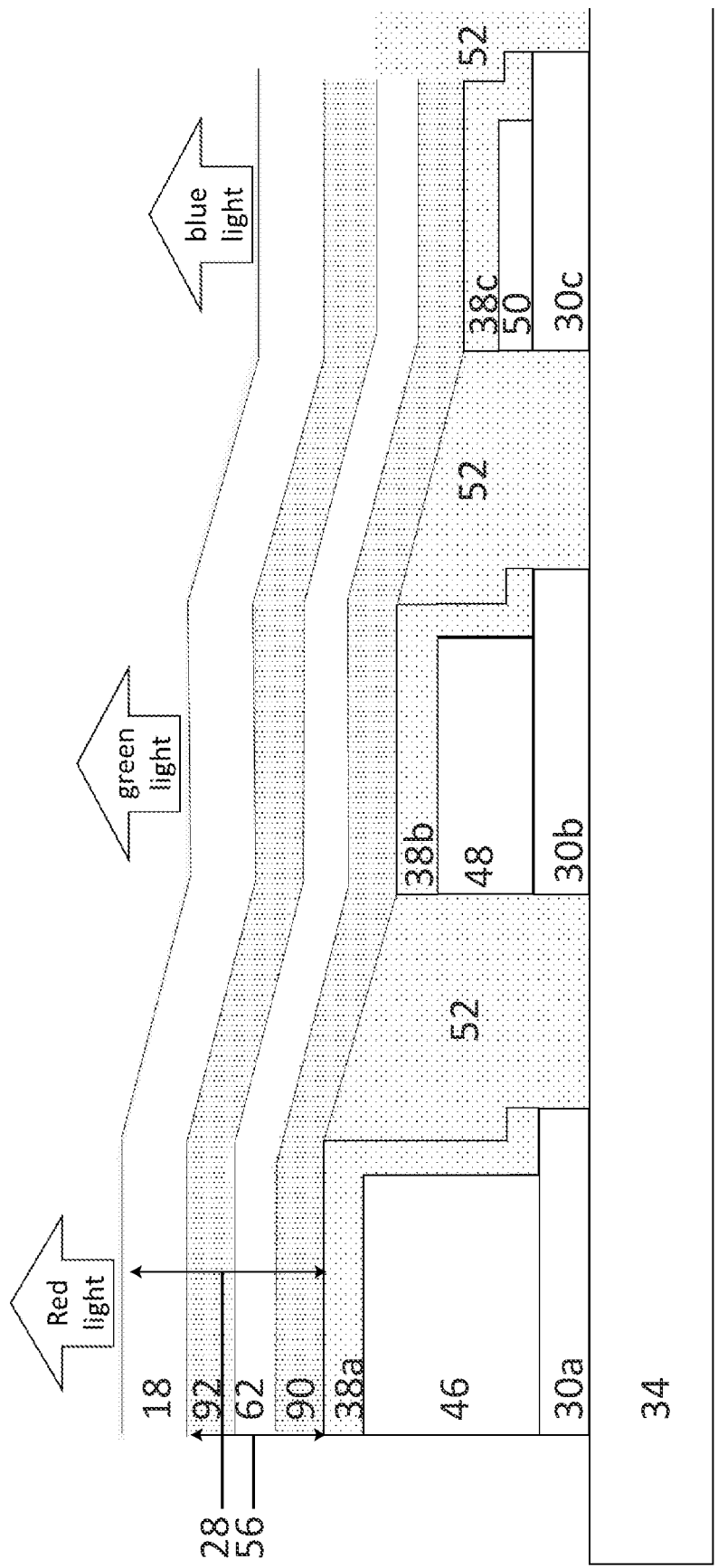
FIG. 13: illustrates an embodiment for fabrication of a multi-color MCOLED array including a shared top electrode which acts as a reflective surface to form the optical microcavity of the MCOLED.
Figure 17A:
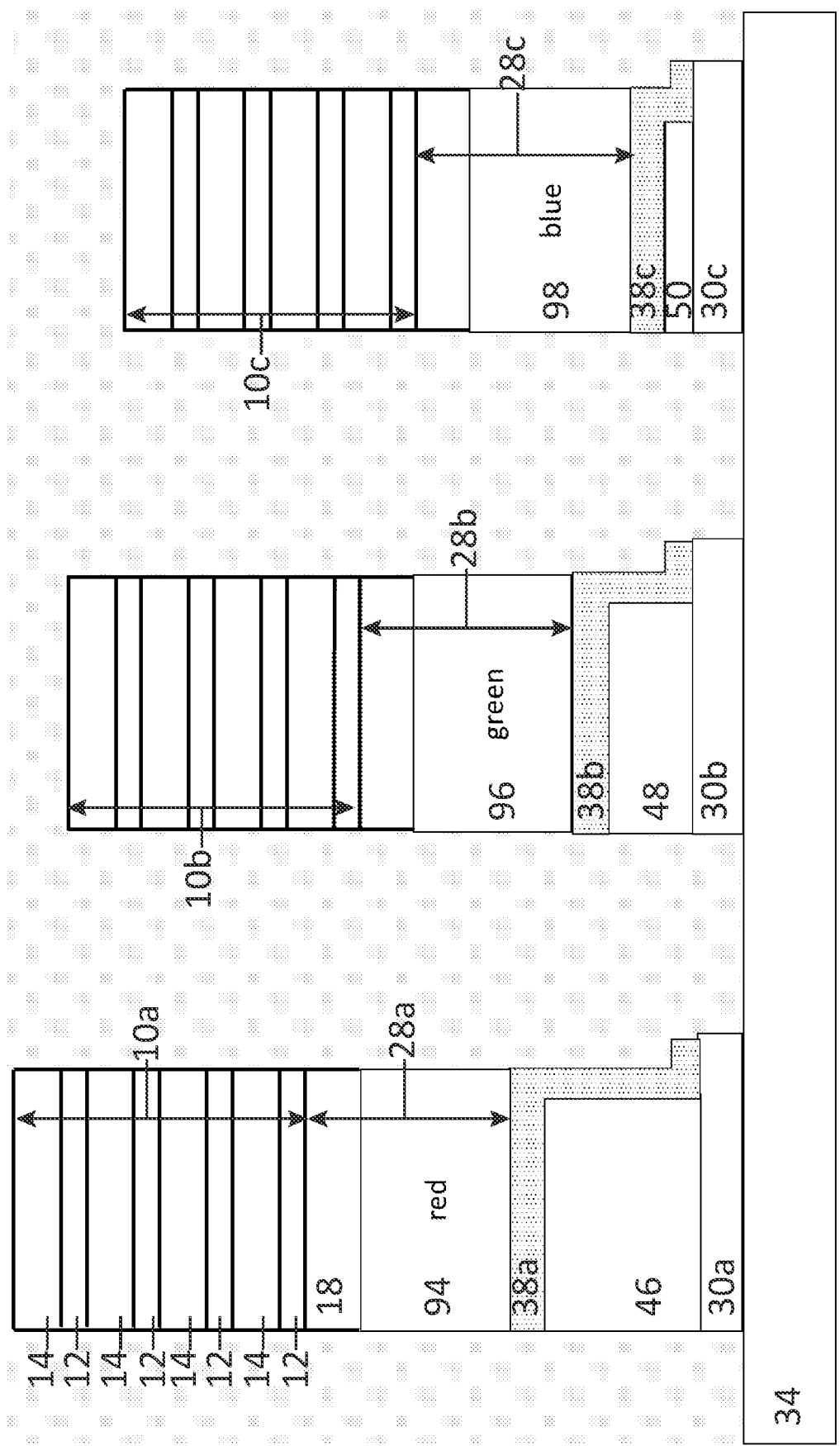
FIG. 17A: illustrates a side view of a multi-color MCOLED with individual distributed Bragg reflector (DBR) structures.

FIG. 17A illustrates a side view of a multi-color MCOLED array with Red OLED stack 94, Green OLED stack 96, and Blue OLED stack 98 with individual distributed Bragg reflectors 10a, 10b, 10c. The method of fabricating this embodiment includes a bottom first series of electrodes 30a, 30b, 30c deposited on a single substrate 34. The electrodes can be deposited by, for example, physical vapor deposition (PVD) such as thermal evaporation, electron-beam evaporation, sputtering, or by chemical vapor deposition (CVD) methods such as atomic layer deposition. Each structure in the MCOLED array has a filler layer deposited separately for each of red, green and blue, deposited as a filler layer for red color 46, a filler layer for green color 48, and a filler layer for blue color 50. Each filler layer can be deposited by physical vapor deposition (PVD) such as thermal evaporation, electron-beam evaporation, sputtering or chemical vapor deposition (CVD) methods such as atomic layer deposition or Plasma-enhanced chemical vapor deposition (PECVD), or by spin coating. An intermediate series of electrodes 38a, 38b, and 38c can be deposited by way of by physical vapor deposition (PVD) such as thermal evaporation, electron-beam evaporation, sputtering; or chemical vapor deposition (CVD) methods such as atomic layer deposition on the RGB filler layers 46, 48, and 50 and forms a connection with each of the series of bottom first electrodes 30. In this embodiment, individual OLED stacks for each color 94, 96, 98 are deposited separately. As shown in FIG. 13, the OLED stack deposited on top of each individual intermediate electrode 38a, 38b, 38c, may be a common white OLED stack. The connection formed between the bottom first electrode and 30 and the intermediate series of electrodes 38a, 38b, 38c allows for blanket deposition of a common white OLED stack. In In this embodiment, the top electrode 18 is deposited using blanket deposition technique over the individual R, G, B OLED stacks 94, 96, 98. Individual distributed Bragg reflectors (DBR) 10a, 10b, 10c are then deposited on top of the top electrode 18 to form the optical microcavities 28a, 28b, 28c. The DBRs 10a, 10b, 10c consist of a series of alternating layers of high refractive index dielectric material 14 and low refractive index dielectric material 12. The DBRs 10a, 10b, 10c act as the second reflective surfaces for the optical microcavities 28a, 28b, 28c.

Figure 17B:
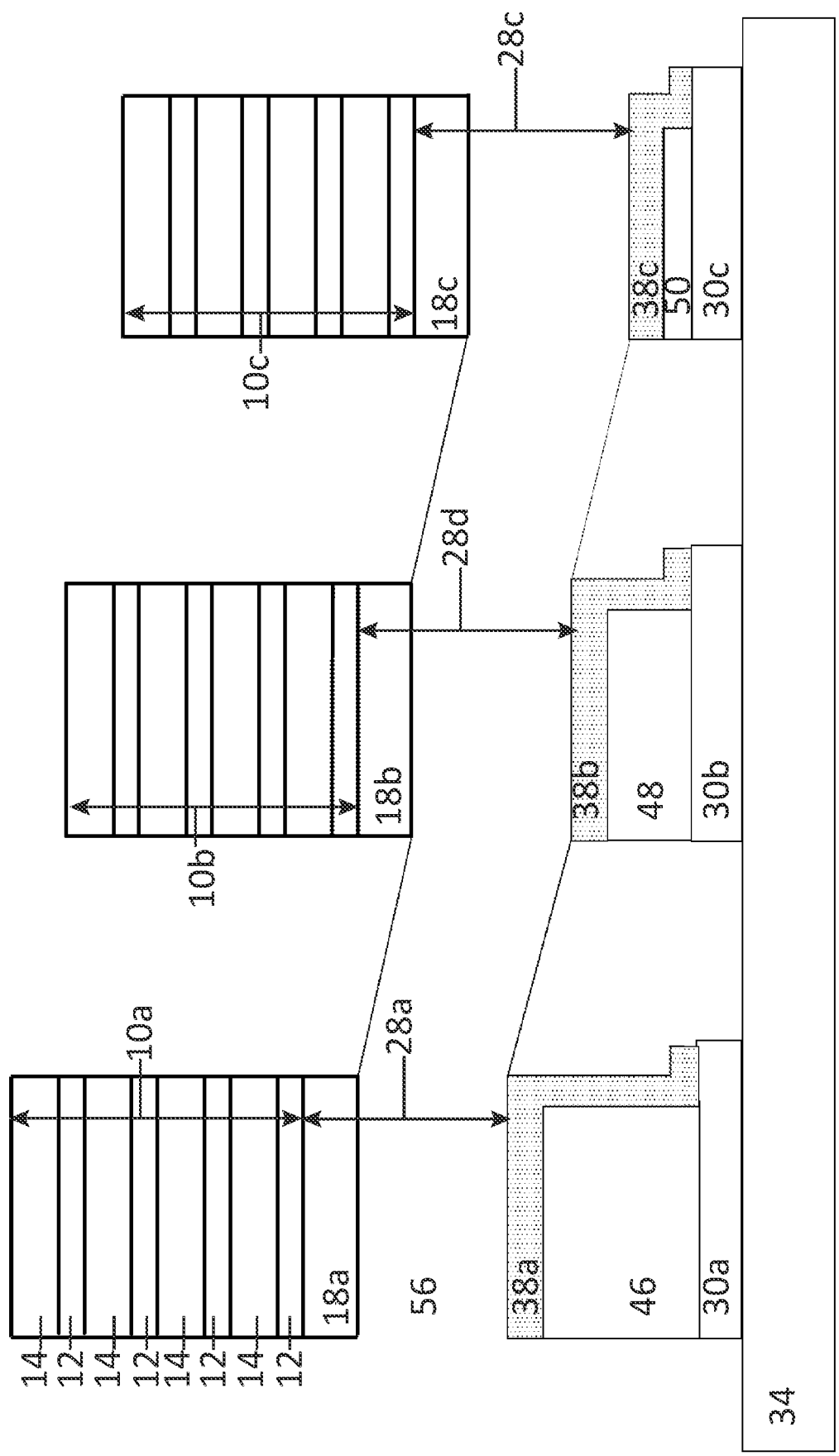
FIG. 17B: illustrates a side view of an alternative embodiment of a multi-color MCOLED with individual distributed Bragg reflector (DBR) structures.

FIG. 17B illustrates a side view of a multi-color MCOLED array with a common white OLED stack 56 with individual distributed Bragg reflectors 10a, 10b, 10c. The method of fabricating this embodiment includes a bottom first series of electrodes 30a, 30b, 30c deposited on a single substrate 34. The electrodes can be deposited by, for example, physical vapor deposition (PVD) such as thermal evaporation, electron-beam evaporation, sputtering, or by chemical vapor deposition (CVD) methods such as atomic layer deposition. Each structure in the MCOLED array has a filler layer deposited separately for each of red, green and blue, deposited as a filler layer for red color 46, a filler layer for green color 48, and a filler layer for blue color 50. Each filler layer can be deposited by physical vapor deposition (PVD) such as thermal evaporation, electron-beam evaporation, sputtering or chemical vapor deposition (CVD) methods such as atomic layer deposition or Plasma-enhanced chemical vapor deposition (PECVD), or by spin coating. An intermediate series of electrodes 38a, 38b, and 38c can be deposited by way of by physical vapor deposition (PVD) such as thermal evaporation, electron-beam evaporation, sputtering; or chemical vapor deposition (CVD) methods such as atomic layer deposition on the RGB filler layers 46, 48, and 50 and forms a connection with each of the bottom first series of electrodes 30a, 30b, 30c. The connection formed between the bottom first series of electrodes and 30a, 30b, 30c and the intermediate series of electrodes 38a, 38b, 38c now allows for blanket deposition of a common white OLED stack 56. This is advantageous in that the white OLED stack 56 may be easily deposited over all devices in the array, regardless of color. The connection formed between the bottom first series of electrodes 30a, 30b, 30c and the intermediate series of electrodes 38a, 38b, 38c allows for blanket deposition of a common white OLED stack 56. A top electrode 18a, 18b, 18c is individually deposited on the white OLED stack 56 for each color, respectively. A common top electrode could also be deposited using blanket deposition as see in FIG. 17A. Individual distributed Bragg reflectors (DBR) 10a, 10b, 10c are then deposited on top of the top electrodes 18a, 18b, 18c to form the optical microcavities 28a, 28b, 28c. The DBRs 10a, 10b, 10c consist of a series of alternating layers of high refractive index dielectric material 14 and low refractive index dielectric material 12. The DBRs 10a, 10b, 10c act as the second reflective surfaces for the optical microcavities 28a, 28b, 28c.

Design Methodology

Figure 18A:
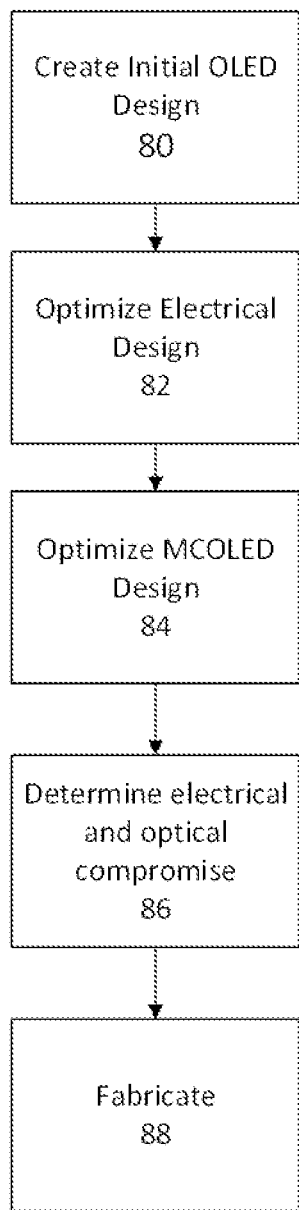
FIG. 18A: illustrates a process schematic of a method for the design and optimization of a microcavity OLED.

FIGS. 18A and B illustrate processes for designing a microcavity pixel. In FIG. 18A, an initial design for the OLED 80 is selected which includes material selections and layer thicknesses. The electrical design of the pixel is then optimized 82. This process consists of balancing the electron-hole charge within the material layers and electrode selection. The pixel design is next placed between two reflective materials, creating a microcavity OLED (MCOLED) which is then optimized 84 to achieve the desired optical path length of the microcavity of the OLED. In the method as illustrated by FIG. 18A, the optical path length is adjusted by adjusting different layers of the MCOLED structure. It should be noted that there are many ways to optimize the structure, including adding a filler layer above an electrode which can be changed to tune the optical path length, similarly varying the electrode thickness can be used, or tuning one or all of the OLED material thicknesses. Following optimization of the MCOLED design 84, the electrical and optical compromise of the alterations to the structure resulting from the optimization are considered 86. This can include re-design of the device layer materials and/or thicknesses to ensure that the resulting structure satisfies all electrical and optical requirements. Once this compromise has been achieved, the structure may be fabricated 88. It should be noted that satisfying the electrical and optical requirements 86 limits material selection and layer thicknesses in optimizing the optical path length and subsequent performance of the device.

Figure 18B:
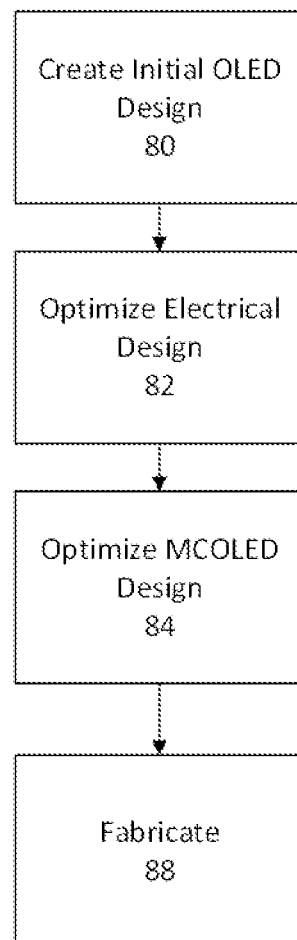
FIG. 18B: illustrates an improved process schematic of a method for the design and optimization of a microcavity OLED as per the present disclosure.

An optimized method for the design of a microcavity pixel device is illustrated in FIG. 18B. Similar to FIG. 18A, an initial design for the OLED 80 is selected which includes material selections and layer thicknesses. The electrical design of the pixel is then optimized 82. This process consists of balancing the electron-hole charge within the material layers and electrode selection. The design of the microcavity OLED (MCOLED) is then optimized 84 to achieve the desired optical path length of the microcavity of the pixel. The MCOLED design as per the present disclosure includes an intermediate electrode which is deposited such that it covers the overhang of the filler layer of the device to connect to the bottom first electrode to form a connecting area thereby forming a contact between the first electrode and the intermediate electrode. The filler layer thickness of the device may be altered to achieve the desired optical path length of the microcavity. This presence of this connection removes the electrical and optical compromise in material type and thickness considerations resulting from the optimization of the MCOLED as seen in FIG. 18A. This advantage of this method is there is a much wider selection of materials and layer thicknesses suitable for optimizing the optical path length and performance of the device.

EXAMPLES

Example 1

Figure 14:
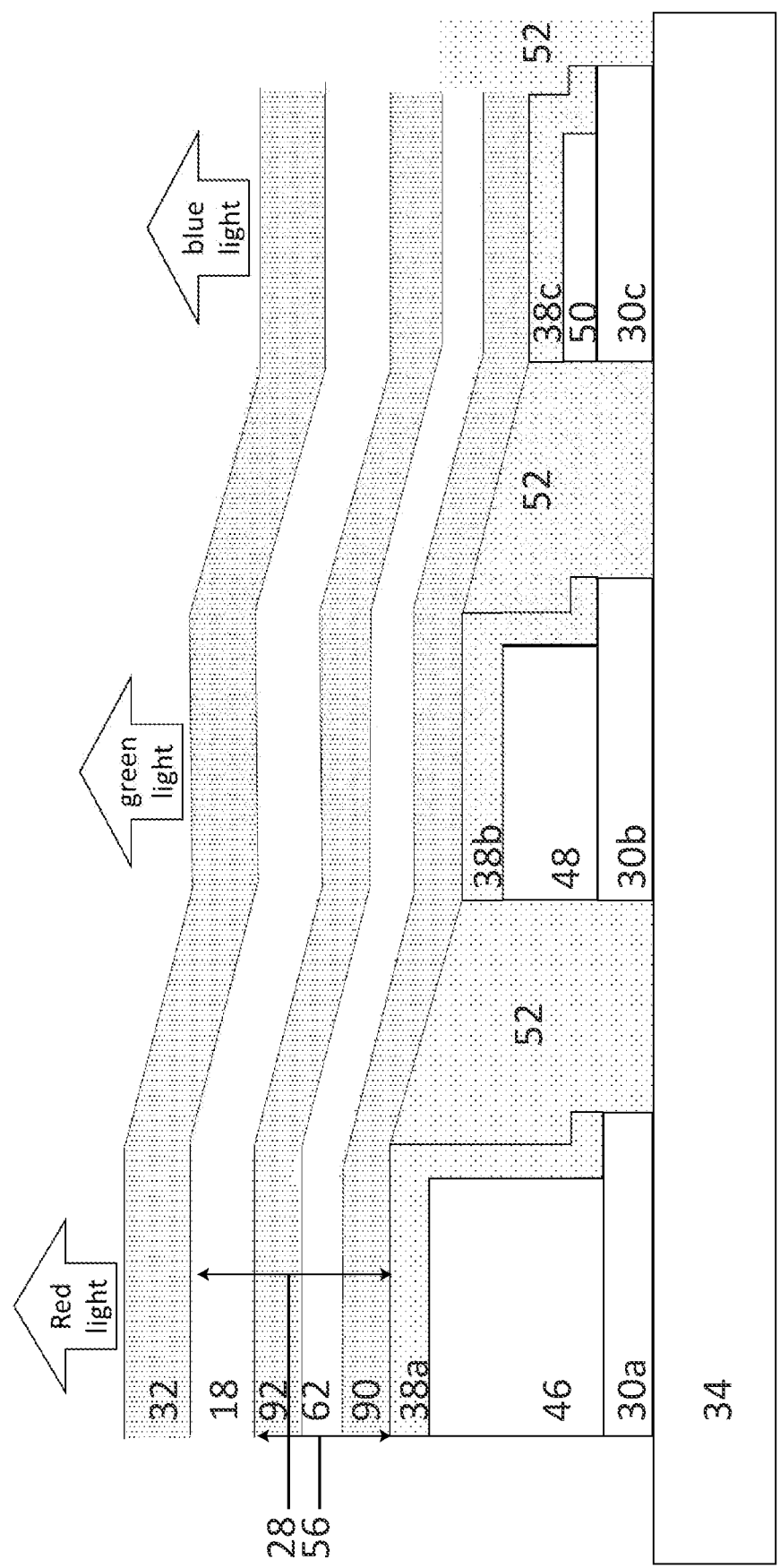
FIG. 14: illustrates an embodiment for fabrication of a multi-color MCOLED array including a shared reflective surface on the top electrode to form the optical microcavity of the MCOLED.

FIG. 13 illustrates an example of a method for fabricating a multi-color microcavity OLED array as per the present disclosure. The method begins with deposition of a bottom first series of electrodes 30a, 30b, 30c on a single substrate 34. A filler layer for red color 46 electrodes is deposited on the bottom first electrode 30a. A filler layer for green color 48 electrodes is deposited on the bottom first electrode 30b. A filler layer for blue color 50 electrodes is deposited the bottom first electrode 30c. Although red, green, and blue are the selected and standard colors for OLED devices, it is understood that colors other than red, green, and blue may be used. A series of intermediate electrodes 38a, 38b, 38c is then deposited over the filler layers 46, 48, and 50, respectively, such that the intermediate series of electrodes 38a, 38b, 38c cover the overhang of the filler layer for red color 46 electrodes, the filler layer for green color 48 electrodes, and the filler layer for blue color 50 electrodes, respectively, to connect to the bottom first series of electrodes 30a, 30b, 30c, thereby forming a contact between the bottom first series of electrodes 30a, 30b, 30c and the intermediate series of electrodes 38a, 38b, 38c. In this example, an optional pixel definition layer (PDL) 52 is patterned such that such that the overhang area of the PDL 52 covers the connection area between the bottom first series of electrodes 30a, 30b, 30c, and intermediate series of electrodes 38a, 38b, 38c. A white OLED stack 56 is then deposited using blanket deposition over the series of intermediate electrodes 38. A white OLED stack 56 containing a white emission layer 62 may be blanket deposited as it contains all three R, G, B prime colors, and with the optical microcavity 28, only the desired color would exit the corresponding pixel as the optical microcavity 28 filters out other colors. The white OLED 56 stack comprises organic layers 90 beneath the emission layer 62, which could include an EIL, ETL, EML, HTL, or a HIL, depending on the configuration of the OLED (inverted versus conventional). Additionally, the white OLED 56 stack comprises organic layers 92 on top of the emission layer 62, which could include an EIL, ETL, EML, HTL, or a HIL, depending on the configuration of the OLED (inverted versus conventional). The top electrode is deposited by blanket deposition over the white OLED stack 56 common to all MCOLED structures. A top electrode 18 is deposited using blanket deposition over the white OLED stack 56. FIG. 14 illustrates an example of a method for fabricating a multi-color microcavity OLED array as per FIG. 13 wherein an additional reflective surface 32 is deposited by blanket deposition over the common top electrode to form the optical microcavities 28 of each device.

Example 2

Figure 15:
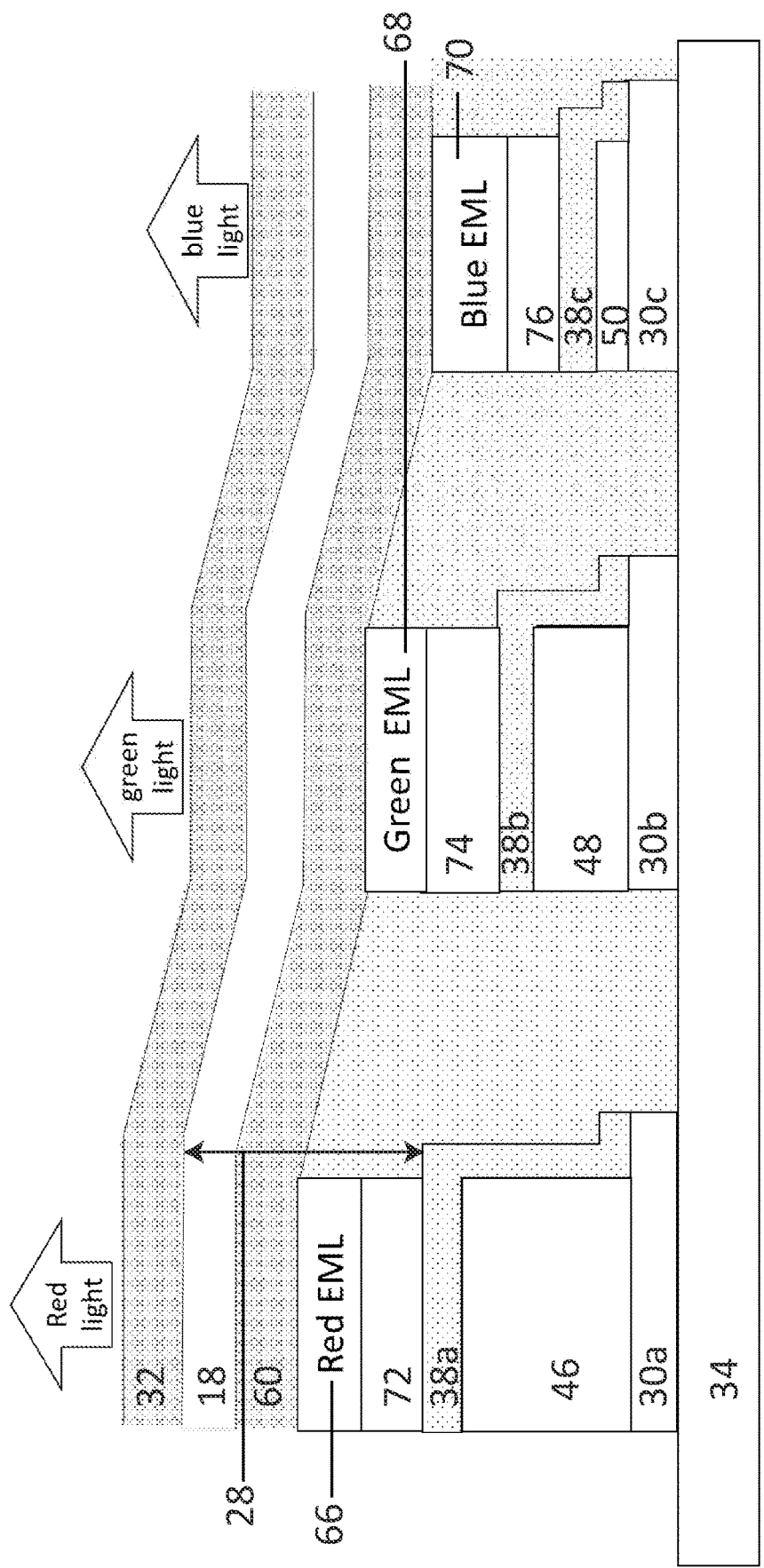
FIG. 15: illustrates an alternative embodiment for fabrication of a multi-color MCOLED array.

FIG. 15 illustrates an example method for fabricating a multi-color microcavity OLED array as per the present disclosure. The method begins with deposition of a bottom first series of electrodes 30a, 30b, 30c on a single substrate 34. A filler layer for red color 46 electrodes is deposited on the bottom first electrode 30a. A filler layer for green color 48 electrodes is deposited on the bottom first electrode 30b. A filler layer for blue color 50 electrodes is deposited on the bottom first electrode 30c. A series of intermediate series of electrodes 38a, 38b, 38c is deposited over the filler layers 46, 48, and 50 such that the intermediate series of electrodes 38a, 38b, 38c cover the overhang of the filler layer for red color 46 electrodes, the filler layer for green color 48 electrodes, and the filler layer for blue color 50 electrodes, respectively, to connect to the bottom first series of electrodes 30a, 30b, 30c, thereby forming a contact between the bottom first series of electrodes 30a, 30b, 30c, and the intermediate series of electrodes 38a, 38b, 38c. The layers of an OLED stack for a first color (Red) 72 before the red emissive layer (EML) 66 are deposited on the intermediate electrode 38a which is stacked on top of the filler layer for red color 46. The layers of an OLED stack for a second color (Green) 74 before the green emissive layer (EML) 68 are deposited on the intermediate electrode 38b which is stacked on top of the filler layer optimized for the green color 48. The layers of an OLED stack for a third color (Blue) 76 before the blue emissive layer (EML) 70 are deposited on the intermediate electrode 38c which is stacked on top of the filler layer optimized for the third color 50. Layers of an OLED stack for each color 72, 74, 76 before the emissive layer 66, 68, 70 respectively, could include an EIL, ETL, EML, HTL, or a HIL, depending on the configuration of the OLED (inverted versus conventional). The emissive layers (EML) for each respective color (RGB) are then patterned individually over the respective layers before the EML for each color 72, 74, and 76. In this example, the organic layers 60 after the EMLs 72, 74, and 76 may be blanket deposited over all EMLs 72, 74, and 76 and could include an EIL, ETL, EML, HTL, or a HIL, depending on the configuration of the OLED (inverted versus conventional). A top electrode 18 is also deposited using blanket deposition and an additional reflective surface 32 to form the optical microcavity 28 of each structure.

The disclosures of all patents, patent applications, publications and database entries referenced in this specification are hereby specifically incorporated by reference in their entirety to the same extent as if each such individual patent, patent application, publication and database entry were specifically and individually indicated to be incorporated by reference. Although the invention has been described with reference to certain specific embodiments, various modifications thereof will be apparent to those skilled in the art without departing from the spirit and scope of the invention. All such modifications as would be apparent to one skilled in the art are intended to be included within the scope of the following claims.

REFERENCE LIST

1. G. Bj¨ork, Y. Yamamoto, and H. Heitmann, Spontaneous Emission Control in Semiconductor Microcavities, pp. 467-501. Boston, MA: Springer US, 1995.
2. A. Dodabalapur, L. J. Rothberg, R. H. Jordan, T. M. Miller, R. E. Slusher, and J. M. Phillips, "Physics and applications of organic microcavity light emitting diodes," Journal of Applied Physics, vol. 80, no. 12, pp. 6954-6964, 1996.
3. B. Masenelli, A. Gagnaire, L. Berthelot, J. Tardy, and J. Joseph, "Controlled spontaneous emission of a tri(8-hydroxyquinoline) aluminum layer in a microcavity," Journal of Applied Physics, vol. 85, no. 6, pp. 3032-3037, 1999.
4. M. S. Skolnick, T. A. Fisher, and D. M. Whittaker, "Strong coupling phenomena in quantum microcavity structures," Semiconductor Science and Technology, vol. 13, no. 7, p. 645, 1998.
5. C. W. Wilmsen, H. Temkin, and L. A. Coldren, Vertical-Cavity Surface-Emitting Lasers. July 1999. Lumerical, "FDTD solutions, ver. 8.18.1365," 2017.
6. H. Sugawara, K. Itaya, and G. ichi Hatakoshi, "Hybrid-type ingaalp/gaas distributed bragg reflectors for ingaalp light-emitting diodes," Japanese Journal of Applied Physics, vol. 33, no. 11R, p. 6195, 1994.
7. A. B. Djurišić and A. D. Rakić, "Organic microcavity light-emitting diodes with metal mirrors: dependence on the emission wavelength on the viewing angle," Appl. Opt., vol. 41, pp. 7650-7656, December 2002.
8. S. Tokito, T, Tsutsui, and Y. Taga, "Microcavity organic light-emitting diodes for strongly directed pure red, green, and blue emissions," Journal of Applied Physics, vol. 86, no. 5, pp. 2407-2411, 1999.
9. Y. Karzazi, "Organic Light Emitting Diodes: Devices and applications," Journal of Materials and Environmental Science, vol. 5, no. 1, pp. 1-12, 2014.

We claim:

1. A method for fabrication of a multi-colored microcavity organic light emitting diode (MCOLED) array, the method comprising:
    patterning a bottom first series of electrodes on a substrate;
    depositing a first filler layer selected for a first color on top of a first group of electrodes in the series of electrodes;
    depositing a second filler layer selected for a second color on top of a second group of electrodes in the bottom first series of electrodes;
    depositing an intermediate series of electrodes on the first filler layer and the second filler layer, each electrode in the intermediate series of electrodes comprising an overhang region and a connecting area, the connecting area electrically connecting each electrode in the intermediate series of electrodes to an electrode in the bottom first series of electrodes;
    depositing a organic light emitting diode stack on the intermediate series of electrodes;
    depositing a top series of electrodes on the organic light emitting diode stack; and
    depositing a distributed Bragg reflector (DBR) on top of the top series of electrodes, the DBR comprising alternate layers of dielectric materials and forming an optical microcavity with a resonance wavelength between the intermediate series of electrodes and the DBR, the DBR having a high reflectivity with dielectric layer thicknesses chosen such that the optical path length of each layer in the DBR is one quarter of the resonance wavelength of the optical microcavity.

2. The method of claim 1, wherein the first filler layer has a first thickness different than a thickness of the second filler layer.

3. The method of claim 1, wherein the first filler layer is comprised of a first material and the second filler layer is comprised of a second material different than the first material.

4. The method of claim 1, wherein the top series of electrodes comprises a reflective surface.

5. The method of claim 1, wherein depositing the organic light emitting diode stack comprises depositing a first monochromatic OLED stack for the first color on the intermediate series of electrodes on top of the first filler layer and depositing a second monochromatic OLED stack for the second color on the intermediate series of electrodes on top of the second filler layer.

6. The method of claim 1, wherein depositing the organic light emitting diode stack comprises depositing a white OLED stack on the series of intermediate electrodes.

7. The method of claim 1, further comprising depositing a third filler layer selected for a third color on top of a third group of electrodes in the bottom first series of electrodes.

8. The method of claim 1, further comprising depositing a pixel definition layer to cover the overhang region and leaving a portion of each intermediate electrode uncovered by the pixel definition layer forming an active area of the intermediate electrode.

9. The method of claim 1, wherein the first filler layer and the second filler layer are comprised of an inorganic material or an organic material.

10. The method of claim 1, wherein the first filler layer and the second filler layer are comprised of one or more layers of different materials.

11. The method of claim 1, wherein the intermediate series of electrodes comprise a semi-transparent conductive material.

12. The method of claim 1, wherein the intermediate series of electrodes comprise a transparent conductive oxide material.

13. The method of claim 1, wherein the top series of electrodes comprise semi-transparent metal.

14. The method of claim 1, wherein the top series of electrodes consist of a transparent surface.

15. The method of claim 1, wherein the distributed Bragg reflector is a common shared distributed Bragg reflector.

16. The method of claim 1, wherein the first group of electrodes in the series of electrodes has a first distributed Bragg reflector and the second group of electrodes in the series of electrodes has a second distributed Bragg reflector.

17. A method for fabrication of a multi-colored microcavity organic light emitting diode array, the method comprising:
    patterning a bottom first series of electrodes on a substrate;
    depositing a first filler layer selected for a first color on top of a first group of electrodes in the bottom first series of electrodes;
    depositing a second filler layer selected for a second color on top of a second group of electrodes in the bottom first series of electrodes;
    depositing an intermediate series of electrodes on the first filler layer and the second filler layer, each electrode in the intermediate series of electrodes comprising an overhang region electrically connecting each intermediate electrode to a corresponding electrode in the bottom first series of electrodes;
    blanket depositing a white organic light emitting stack on the intermediate series of electrodes; and
    blanket depositing a top series of electrodes on the white organic light emitting stack; and
    depositing a distributed Bragg reflector (DBR) on top of the top series of electrodes, the DBR comprising alternate layers of dielectric materials, the DBR forming an optical microcavity with a resonance wavelength between the intermediate series of electrodes and the DBR, the DBR having a high reflectivity with dielectric layer thicknesses chosen such that the optical path length of each layer in the DBR is one quarter of the resonance wavelength of the optical microcavity.

18. A method for fabricating a microcavity organic light emitting diode (MCOLED) comprising:
    depositing a bottom electrode on a substrate;
    depositing a filler layer on top of the bottom electrode;
    depositing an intermediate electrode on top of the filler layer, the intermediate electrode comprising an overhang region and a connecting area, the connecting area electrically connecting each the intermediate electrode to the bottom electrode;
    depositing an organic light emitting diode stack on the intermediate electrode;
    depositing a top electrode on the organic light emitting diode stack; and
    depositing a distributed Bragg reflector (DBR) on top of the top electrode, the DBR comprising alternate layers of dielectric materials and forming an optical microcavity with a resonance wavelength between the intermediate electrode and the DBR, the DBR having a high reflectivity with dielectric layer thicknesses chosen such that the optical path length of each layer in the DBR is one quarter of the resonance wavelength of the optical microcavity.

19. The method of claim 18, wherein the filler layer thickness and material is selected to emit a desired wavelength range of light from the MCOLED.

20. The method of claim 18, further comprising depositing a pixel definition layer to cover the overhang region and leaving a portion of the intermediate electrode uncovered by the pixel definition layer forming an active area of the intermediate electrode.

* * * * *